（12) United States Patent
Blodgett et al.

(10) Patent No.: US 6,750,695 B2
(45) Date of Patent: Jun. 15, 2004

(54) VOLTAGE PUMP AND A LEVEL TRANSLATOR CIRCUIT

(75) Inventors: Greg A. Blodgett, Nampa, ID (US); Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/338,191

(22) Filed: Jan. 7, 2003

(65) Prior Publication Data

US 2003/0094997 A1 May 22, 2003

Related U.S. Application Data

(62) Division of application No. 09/128,865, filed on Aug. 4, 1998, now Pat. No. 6,504,421, which is a continuation of application No. 08/616,026, filed on Mar. 13, 1996, now Pat. No. 5,811,990, which is a continuation-in-part of application No. 08/393,573, filed on Feb. 23, 1995, now Pat. No. 5,537,306, which is a continuation of application No. 08/137,565, filed on Oct. 15, 1993, now Pat. No. 5,394,320.

(51) Int. Cl.[7] .................................................. H03L 5/00
(52) U.S. Cl. ......................... 327/333; 327/536; 326/81
(58) Field of Search ................................ 327/333, 112, 327/536, 589, 390; 326/68, 80–81, 26–27, 83, 86, 88, 95, 98

(56) References Cited

U.S. PATENT DOCUMENTS

| | | | |
|---|---|---|---|
| 4,798,977 A | 1/1989 | Sakui et al. ................ 307/446 |
| 4,839,787 A | 6/1989 | Kojima et al. ................ 363/60 |
| 4,970,409 A | 11/1990 | Wada et al. ............. 307/296.1 |
| 4,996,449 A | 2/1991 | Ueno ......................... 307/446 |
| 5,029,282 A | 7/1991 | Ito ........................... 307/296.8 |
| 5,038,325 A | 8/1991 | Douglas et al. ........ 365/189.06 |
| 5,051,881 A | 9/1991 | Herold ........................ 363/60 |
| 5,140,182 A | 8/1992 | Ichimura ................ 307/296.1 |
| 5,148,058 A | 9/1992 | Stewart ...................... 307/453 |
| 5,153,451 A | * 10/1992 | Yamamura et al. ......... 327/333 |
| 5,175,448 A | 12/1992 | Fujii .......................... 307/482 |
| 5,245,524 A | 9/1993 | Nakagawa et al. ........... 363/62 |
| 5,280,420 A | 1/1994 | Rapp ........................... 363/60 |
| 5,347,171 A | 9/1994 | Cordoba et al. ......... 307/296.2 |
| 5,386,151 A | 1/1995 | Folmsbee .................... 327/536 |
| 5,394,320 A | 2/1995 | Blodgett ...................... 363/60 |
| 5,412,257 A | 5/1995 | Cordoba et al. ............. 327/536 |
| 5,418,477 A | * 5/1995 | Dhong et al. .................. 326/71 |

(List continued on next page.)

Primary Examiner—Terry D. Cunningham
Assistant Examiner—Quan Tra
(74) Attorney, Agent, or Firm—Schwegman, Lundberg, Woessner & Kluth, P.A.

(57) ABSTRACT

A voltage pump and method of driving a node to an increased potential. A periodic input signal is fed into a precharged small capacitor to create a level shifted periodic intermediate potential at an intermediate node. The intermediate node is a supply node to a level translator circuit. The output of the level translator circuit controls the actuation of a pass transistor. When actuated the pass transistor drives a boosted potential to an output node of the voltage pump circuit. In one embodiment the level translator circuit has a delay element which maintains the deactivation of a pull down portion of the level translator circuit until a pull up portion of the level translator circuit is deactivated. A first diode clamp is used to limit the output of the level translator circuit and the boosted potential to within 1 threshold voltage (of the diode clamp) of each other. A second diode clamp is connected between the terminals of the pass transistor so that the boosted potential does not need to climb above the output potential plus a Vt of the second diode clamp. This in turn limits the gate potential of the transistor through the first diode clamp. In a further embodiment a precharge circuit precharges the first terminal of the transistor to a potential equal to the intermediate potential minus a threshold voltage of the precharge circuit.

21 Claims, 17 Drawing Sheets

U.S. PATENT DOCUMENTS

| | | | |
|---|---|---|---|
| 5,436,587 A | 7/1995 | Cernea | 327/536 |
| 5,438,504 A | 8/1995 | menegoli | 363/60 |
| 5,444,408 A * | 8/1995 | Merritt | 327/306 |
| 5,552,747 A | 9/1996 | Tomasini et al. | 327/536 |
| 5,559,464 A | 9/1996 | Orii et al. | 327/333 |
| 5,572,146 A | 11/1996 | Ahn et al. | 326/27 |
| 5,636,115 A | 6/1997 | Drouot | 363/60 |
| 5,701,096 A | 12/1997 | Higashiho | 327/536 |
| 5,801,577 A | 9/1998 | Tailliet | 327/536 |

* cited by examiner

VOLTAGE PUMP AND A LEVEL TRANSLATOR CIRCUIT

This application is a Divisional of U.S. application Ser. No. 09/128,865, filed Aug. 4, 1998, now U.S. Pat. No. 6,504,421 which is a Continuation of U.S. application Ser. No. 08/616,026, filed Mar. 13, 1996, now U.S. Pat. No. 5,811,990, which is a Continuation-In-Part of U.S. application Ser. No. 08/393,573, filed Feb. 23, 1995, now U.S. Pat. No. 5,537,306, which is a Continuation of U.S. application Ser. No. 08/137,565, filed Oct. 15, 1993, now U.S. Pat. No. 5,394,320, all of which are incorporated herein by reference.

FIELD OF THE INVENTION

The invention relates to semiconductor circuit devices, and more particularly to charge pump circuits for providing a voltage to various components on semiconductor integrated circuits. The invention is particularly applicable to dynamic random access memory device (DRAMS).

BACKGROUND OF THE INVENTION

In order to pass a full charge to a DRAM memory cell through an n-channel access transistor, it is necessary to drive the gate of the n-channel access transistor to a voltage greater than the voltage used to charge the storage capacitor. Modern dynamic random access memories (DRAMs) use charge pumps to generate this higher potential. U.S. Pat. No. 5,038,325, entitled "High Efficiency Charge Pump Circuit" describes one charge pump and is herein incorporated by reference.

In order to pass a full charge to a DRAM memory cell through an n-channel access transistor, it is necessary to drive the gate of the n-channel access transistor to a voltage greater than the voltage used to charge the storage capacitor. Modern dynamic random access memories (DRAMs) use charge pumps to generate this higher potential.

A typical external supply potential is referred to as $V_{CCX}$. $V_{CCX}$ is often regulated. The internally regulated potential is referred to as $V_{CC}$. In many applications $V_{CCX}$ is equal to 5 volts and $V_{CC}$ is regulated to 3.3 volts. A potential generated in a charge pump is generally referred to as $V_{CCP}$. In typical cases $V_{CCP}$ is two volts greater than the DRAM's internal regulated voltage, or two volts above $V_{CCX}$ for DRAM's that do not use a regulated $V_{CC}$.

Previous charge pump circuits have had difficulty operating with a $V_{CC}$ below three volts. There have been attempts to design circuits to overcome this problem.

In one attempt to increase the efficiency of a charge pump having a regulated supply potential, a level translator circuit was added between the logic of the pump, and the pump capacitors. The level translator allowed the circuit to draw current from the external power source $V_{CCX}$ rather than the regulated source $V_{CC}$. With this circuit a potential of ($2V_{CCX}-V_t$) could be passed through a pump n-channel transistor as $V_{CCP}$, where $V_t$ is the threshold voltage of the pump n-channel transistor. Thus for a $V_{CCX}$ of 4 volts, the $V_{CCP}$ is equal to 7 volts for a $V_t$ of 1 volt. This is sufficient for transferring a full $V_{CC}$ into a memory location of a DRAM. In early regulated devices, $V_{CC}$ may range from 3.5 to 4 volts. However, there is currently a trend toward lower levels of $V_{CCX}$. Current specifications require $V_{CCX}$ of 2.7 to 3.6 volts, and the trend is toward even lower $V_{CCX}$ levels. In systems with low $V_{CCX}$, there is no longer a need for a regulated $V_{CC}$. Instead, $V_{CCX}$ is used throughout the circuit. $V_{CCP}$ is still required to pass a full $V_{CCX}$ in to the DRAM memory cell. As $V_{CCX}$ is reduced, the efficiency of the $V_{CCP}$ pump is also reduced since the charge available for transfer to $V_{CCP}$ is proportional to $V_{CCX}$ times the capacitance of the pump capacitor. Thus as $V_{CCX}$ values are reduced conventional pump mechanisms eventually fail to function.

In another attempt $2V_{CCX}$ can be passed through as $V_{CCP}$ in a two stage pump by using one pump to generate the entire supply voltage for a second pump. This approach is inefficient for a low level supply potential and is impractical since all the charge eventually is generated from the first pump. In this configuration a very large first stage pump is required to provide the required supply potential for the second stage pump.

Thus a need exist to provide a pumped potential at the gate of the access transistor such that the full charge on the memory storage capacitor is passed through the access transistor for devices with low $V_{CCX}$.

SUMMARY OF THE INVENTION

The invention includes a charge pump circuit for generating a pumped potential and methods of its operation. In one exemplary embodiment the pumped potential is used to pass a full charge to or from a storage capacitor of a dynamic random access memory (DRAM). An exemplary embodiment of a charge pump circuit in accordance with the present invention features a first stage circuit and a second stage circuit providing minimal loading of the first stage circuit by the second stage circuit The pumped potential passed from the second stage circuit to a charge pump output node comes primarily from $V_{CCX}$ and not from the first stage pump. This allows the first stage to remain small.

In this exemplary embodiment the first stage circuit of the invention generates an intermediate pumped potential greater than an input supply potential. The intermediate pumped potential becomes a supply potential for a portion of the second stage circuit. The second stage circuit generates a pumped output potential greater than the intermediate pumped potential.

Both the first and second stage circuits have at least two capacitors, a small pump capacitor and a large pump capacitor. The first stage circuit of the above described exemplary embodiment supplies the increased intermediate pumped potential to those nodes which are used to charge the small pump capacitor of the second stage circuit. The input supply potential supplies the potential to those nodes which are used to charge the large pump capacitors of both stages and the small pump capacitor of the first stage circuit. The small pump capacitor of the second stage circuit, in turn, supplies the gate voltage to an n-channel pass transistor of the second stage circuit which passes a full charge from the large pump capacitor of the second stage circuit to the output. Charging only the small pump capacitor of the second stage circuit with the intermediate pumped potential minimizes the loading effect of the second stage circuit on the first stage circuit.

The first stage circuit is used to boost the efficiency of the second stage circuit. The loading on the first stage circuit is very small in comparison to the load which will be driven by the pumped output potential. Since the second stage circuit is operating off of the intermediate pumped potential generated from the first stage circuit, it is more efficient and is able to source the $V_{CCP}$ at a lower $V_{CC}$ or $V_{CCX}$ level than if the first and the second stage circuits were running in parallel.

In one embodiment a precharge circuit precharges a first terminal of the pass transistor to a potential equal to the intermediate potential minus a threshold voltage of the precharge circuit. A circuit comprising a level translator is responsive to the intermediate potential to generate a control potential at the gate of the pass transistor which is substantially equal to the boosted potential plus a threshold voltage of the precharge circuit.

Charge transfers from the first terminal to a second terminal of the pass transistor. The charge transferred is proportional to the capacitance of a capacitor charged to the boosted potential and the difference in potential between the boosted potential and the final output potential, as long as the boosted potential is not limited by a pass device.

In a further embodiment the invention is a method which conserves power by adjusting the boosted potential and the control potential to have a difference substantially equal to a threshold voltage when the boosted potential is not limited by a pass device. The boosted potential is applied to the first terminal of the pass transistor and the control potential is applied to the gate of the pass transistor. The method comprises increasing an input supply potential to obtain an intermediate potential greater than the input supply potential, and precharging the first terminal of the pass transistor to equal the intermediate potential minus a threshold voltage of a circuit performing said step of precharging. The pass transistor is actuated and a potential substantially equal to the boosted potential is driven to a second terminal of the pass transistor.

In a further exemplary embodiment in accordance with the present invention there is included a voltage pump circuit and method using a periodic input signal to feed the precharged small capacitor to create a level shifted periodic intermediate potential at an intermediate node. The intermediate node is a supply node to a level translator circuit. The output of the level translator circuit controls the actuation of the pass transistor. When actuated the pass transistor drives the boosted potential to an output node of the voltage pump circuit. The level translator circuit is supplied by the high potential of the periodic intermediate potential for the period of time surrounding the time the pass transistor is turned on.

In a further embodiment in accordance with the present invention, the level translator circuit has a delay element which maintains the deactivation of a pull down portion of the level translator circuit until a pull up portion of the level translator circuit is deactivated. In other words the activation of the pull down portion does not occur until the pull up portion has been deactivated due to the delay element delaying a gate control signal to a transistor of the pull down portion. Since the circuit and method of the invention substantially prohibit the simultaneous activation of the pull up and pull down portions of the level translator circuit crossing current and power consumption are reduced.

The invention also includes the method of maintaining deactivation of the pull down portion until the pull up portion has been activated. In one implementation, this is accomplished by delaying a control signal to the pull down portion.

In one embodiment in accordance with the further exemplary embodiment, the small capacitor is precharged by a precharge circuit of the invention which also responds to a periodic signal to precharge internal nodes of the voltage pump of the invention with a periodic signal.

In still a further embodiment in accordance with the further exemplary embodiment a first diode clamp is used to limit the output of the level translator circuit and the boosted potential to within 1 threshold voltage (of the diode clamp) of each other. A second diode clamp is connected between the terminals of the pass transistor so that the boosted potential does not need to climb above the output potential plus a Vt of second diode clamp. This in turn limits the gate potential of the transistor through the first diode clamp.

DETAILED DESCRIPTION OF THE PREFERRED EMBODIMENTS

The invention provides a charge pump circuit and a method for generating a pumped potential. In one application the pumped potential is used to pass a full charge to or from a storage capacitor of a dynamic random access memory (DRAM). The charge pump circuit of the invention features a first stage circuit having pump capacitors and a second stage circuit having pump capacitors. Both the first and the second stage circuits are connected to either an external supply potential or a regulated supply potential. The first stage circuit increases the supply potential to create an intermediate pumped potential which functions as an additional supply potential to the second stage circuit. There is minimal loading on the first stage associated with the charging of the second stage pump capacitors.

Figure 1:
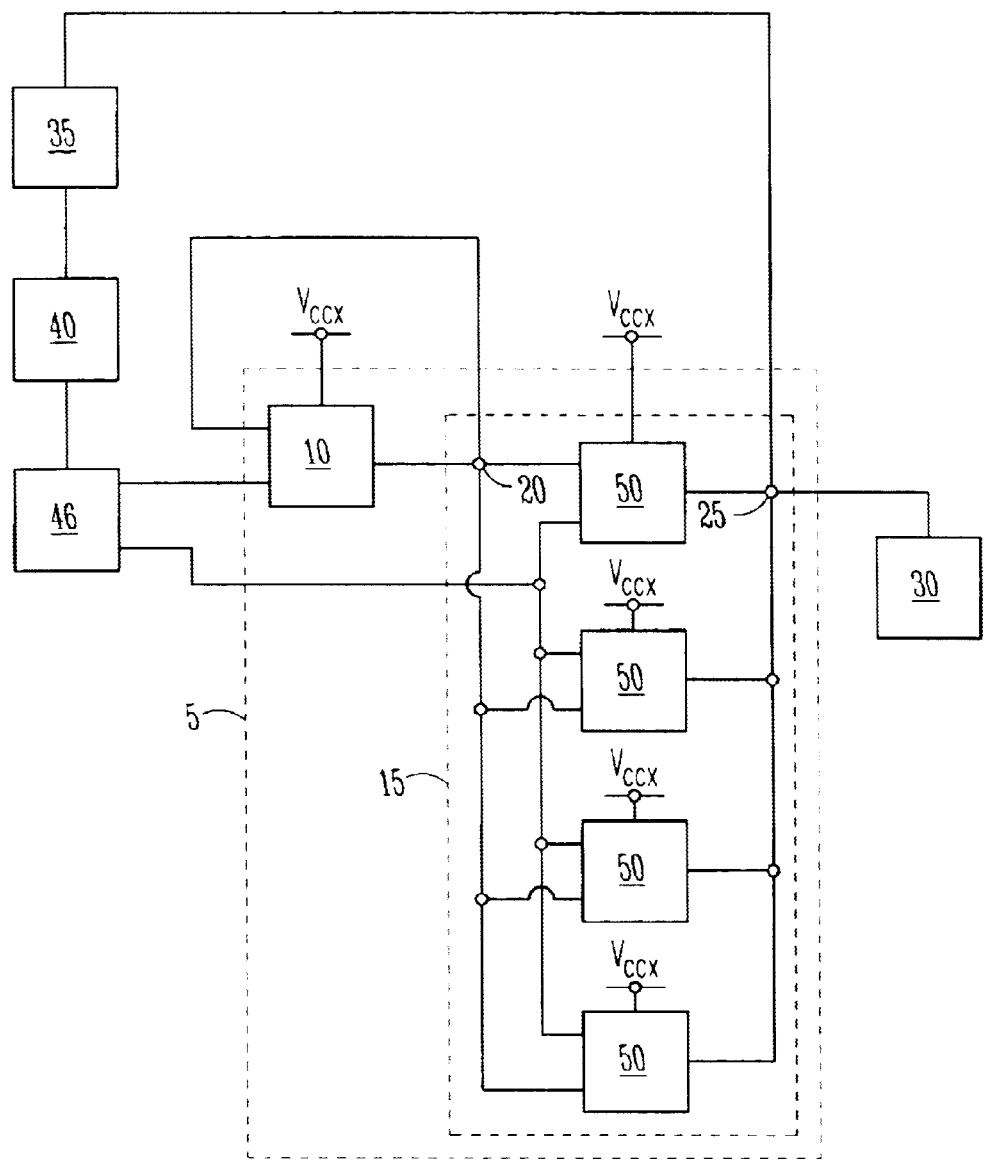
FIG. 1 is a block schematic of a circuit in accordance with the present invention.

FIG. 1 is a block schematic of an exemplary charge pump circuit 5 in accordance with the present invention. The charge pump circuit 5 comprises a first stage circuit 10 and a second stage circuit 15. The first stage circuit 10, which is connected to and driven by an external supply potential, $V_{CCX}$, or alternatively to a regulated $V_{CCX}$ ("$V_{CC}$"), (collectively referred to herein as "$V_{CCX}$"), generates the intermediate pumped potential at intermediate output node 20. The second stage circuit 15 is also connected to and driven by $V_{CCX}$, and the intermediate pumped potential is the additional supply potential to the second stage circuit 15. The second stage circuit 15 generates the pumped output potential ($V_{CCP}$) of the charge pump circuit 5 at node 25. The $V_{CCP}$ at node 25 may be used to pass charge to and from storage capacitors of a DRAM or may drive some other load 30. $V_{CCP}$ is also fed back to a voltage regulator circuit 35 which monitors the value of $V_{CCP}$. When $V_{CCP}$ falls below a desired level the voltage regulator circuit 35 actuates an oscillator circuit 40 which supplies an input signal having a period to a logic circuit 46. The logic circuit, in response to the oscillator signal, generates logic control signals to control the generation of $V_{CCP}$ by the charge pump circuit 5. The intermediate pumped potential is greater than the supply potential of the charge pump circuit 5, and $V_{CCP}$ is greater than the intermediate pumped potential. Regulators and oscillators are well known to those skilled in the art and may be implemented with various circuit configurations.

The second stage circuit 15 of FIG. 1 comprises four subcircuits 50 configured in parallel with each other. Each subcircuit is connected to $V_{CCX}$. Each subcircuit is also connected to the intermediate node 20 and the intermediate pumped potential becomes a supply potential for a portion of each subcircuit 50. Each subcircuit 50 responds to at least one logic control signal. The actual number of subcircuits may vary and may be greater or less than four.

Figure 2:
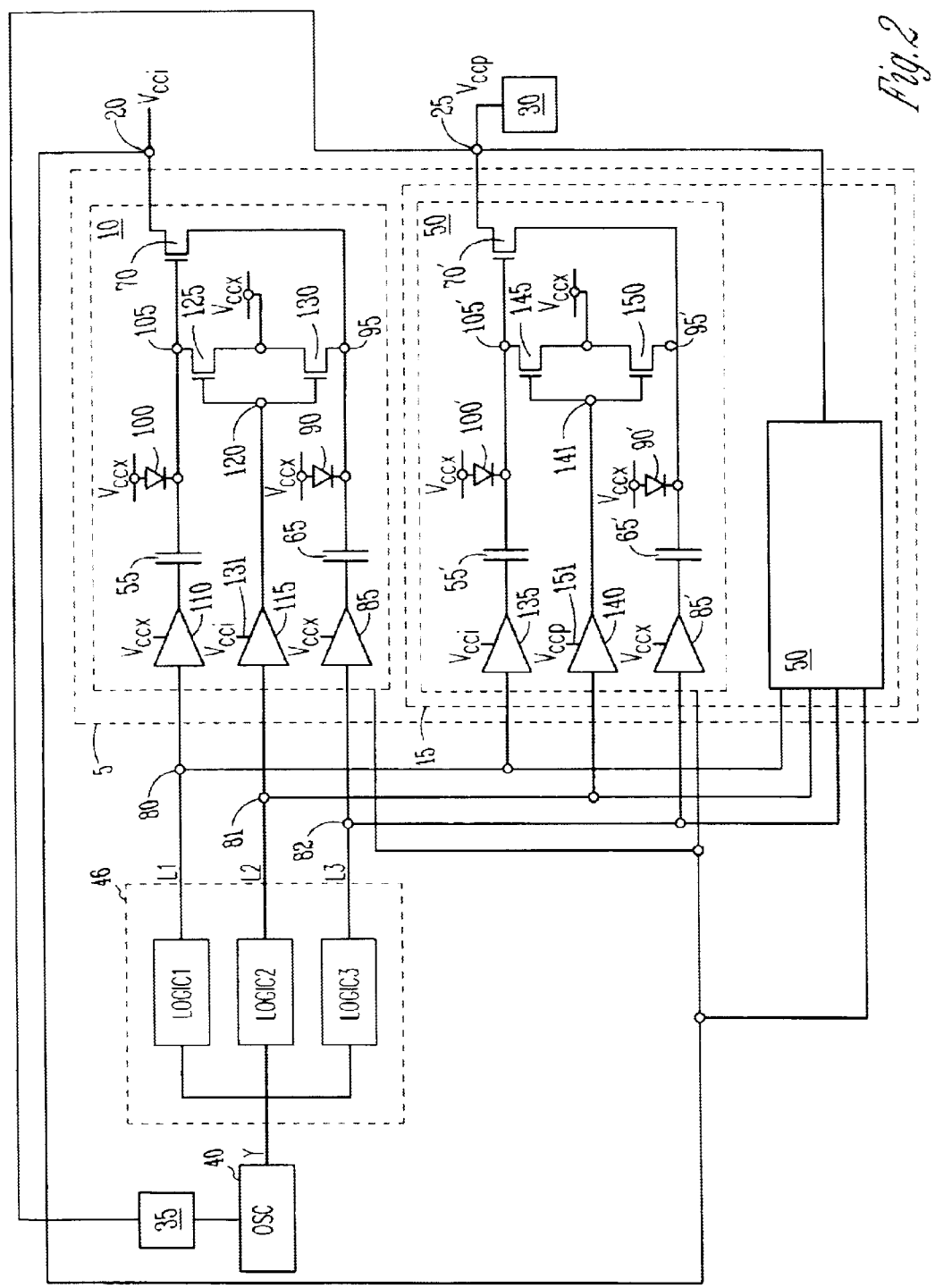
FIG. 2 is a more detailed schematic of the circuit of FIG. 1.

FIG. 2 is a more detailed schematic of the circuit of FIG. 1. Identical elements of FIGS. 1 and 2 have been numbered the same. Only one of the subcircuits 50 is detailed schematically in FIG. 2. The remaining three subcircuits have identical circuitry. Therefore, the description of the detailed subcircuit 50 is valid for the remaining subcircuits, and references to subcircuit 50 in the following description apply to each of the subcircuits 50. Some components in subcircuit 50 will be designated as either a "second stage" or a "first stage" component in order to distinguish similar components of the two circuit stages.

Both the first stage circuit 10 and the subcircuit 50 of the second stage circuit 15 have a small capacitor 55 and a large capacitor 65. In the drawings, and in certain instances in the specification, a second stage element is numbered the same as a corresponding first stage element with the exception that the second stage element is primed. A first stage transistor 70 passes the charge stored on the first stage large capacitor 65 to intermediate node 20 when first stage transistor 70 is gated by the charge stored on the first stage small capacitor 55, and second stage transistor 70' passes the charge stored on the second stage large capacitor 65' to output node 25 when second stage transistor 70' is gated by the charge stored on the second stage small capacitor 55'. First and second stage transistors 70' are connected at their respective input terminals to first and second stage large capacitors 65 respectively.

Although in this embodiment the capacitance of the small capacitor 55 is smaller than the capacitance of the large capacitor 65 the invention is equally applicable when the capacitors have equal capacitances.

The logic circuit 46 responds to the oscillator signal and produces first (L1), second (L2), and third (L3) logic control signals at output nodes 80, 81, and 82 respectively. L1, L2, and L3 are control input signals to both the first 10 and second 15 stage circuits. Each section of the logic circuit 46 can be designed by someone skilled in the art to create the desired logic signals L1, L2, and L3 as described herein, and the exact circuitry is not detailed in this specification.

Figure 3:
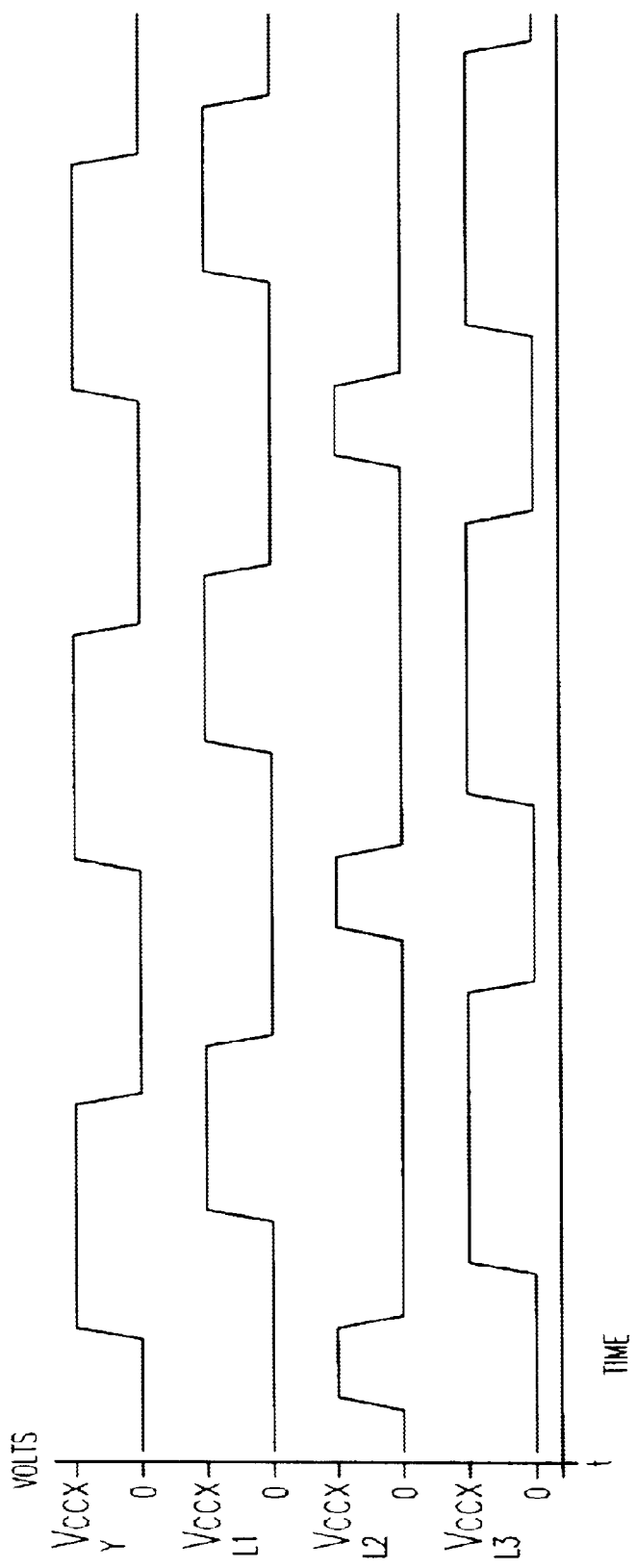
FIG. 3 is a timing diagram of an oscillator signal used to drive logic circuitry of the invention.

In one embodiment L1, L2, and L3 are periodic signals having equal periods which are equal to the period of the oscillator, however the three signals have different duty cycles, as can be seen by examining the timing diagram shown in FIG. 3. The oscillator signal is represented by Y and the logic signals are represented by L1, L2, and L3 in FIG. 3. The vertical axis represents electrical potential and the horizontal axis represents time. Signal L1 transitions low prior to L3 transitioning low and transitions high after L3 transitions high. In this embodiment signal L3 is high longer than it is low, and signal L2 transitions high after both L1 and L3 transition low and returns to the low state while both L1 and L3 are still low.

Referring again to FIG. 2, it can be seen that each of the large capacitors 65 is connected to a buffer 85 which is supplied by $V_{CCX}$. Buffer 85 may alternately be a level translator in the event that the device has a regulated $V_{CC}$ which is used to generate the L1, L2, and L3. In this event 85 would translate the signal L3 from $V_{CC}$ to $V_{CCX}$. This is true in both the first stage circuit 10 and subcircuits 50.

A diode 90 is electrically interposed between each large capacitor 65 and $V_{CCX}$ and is connected to large capacitor 65 at node 95. The diode 90 holds the potential of node 95 at $V_{CCX}-V_{T1}$, where $V_{T1}$ is the threshold voltage of diode 90. A threshold voltage of a device is the minimum potential that must be applied to the device in order for the device to conduct current. When the logic circuit generates a high active signal at node 82, buffers 85 drive a high signal to their respective nodes 95 thereby increasing the potential of nodes 95 by $V_{CCX}$ and bringing the potential of nodes 95 to $2V_{CCX}-V_{T1}$.

A diode 100 is electrically interposed between each small capacitor 55 and $V_{CCX}$ and is connected to small capacitor 55 at node 105. The diode 100 holds the potential of node 105 at $V_{CCX}-V_{T2}$, where $V_{T2}$ is the threshold voltage of diode 100. When the logic circuit generates a high active signal at node 80 level buffer 110 drives a high signal to first stage node 105 thereby increasing the potential of first stage node 105 by $V_{CCX}$ and bringing the potential of first stage node 105 to $2V_{CCX}-V_{T2}$. The $2V_{CCX}-V_{T2}$ on node 105 actuates first stage transistor 70. The charge on first stage node 95 is passed through the actuated first stage transistor 70 with a $V_{T3}$ (the threshold voltage of first stage transistor 70) loss to the intermediate node 20, driving the intermediate node to a potential equal to two times $V_{CCX}$ minus $V_{T2}$ and minus $V_{T3}$. In the case where the two threshold voltages are equal the formula for $V_{CCI}$ is $2V_{CCX}-2V_{T3}$.

The potential of the intermediate node 20 is called the intermediate pumped potential, $V_{CCI}$.

A first stage precharge circuit comprises a level translator circuit 115, a common node 120, and transistors 125 and 130 electrically interposed between $V_{CCX}$ and nodes 105 and 95, respectively. Level translator circuit 115 is connected at a level translator circuit supply node 131 to the intermediate node 20. The level translator circuit 115 is interposed between node 81 and common node 120. Common node 120 is connected to the gates of the transistors 125 and 130. When the logic signal L2 at node 81 goes high it is level translated from $V_{CC}$ or $V_{CCX}$ to the intermediate potential which in turn actuates transistors 125 and 130 thereby precharging first stage nodes 105 and 95 to a full $V_{CCX}$ level.

Since the first stage nodes 105 and 95 are precharged to the full $V_{CCX}$ level they are allowed to swing from $V_{CCX}$ to $2V_{CCX}$, rather than $2V_{CCX}-V_{T2}$, as L1 and L3 swing from 0V to $V_{CC}$. Therefore the potential at the intermediate node is now allowed to swing up to $2V_{CCX}-V_{T3}$, where $V_{T3}$ is the threshold voltage of first stage transistor 70. Once the potential of the intermediate node reaches this value, $2V_{CCX}-V_{T3}$, it is referred to as the intermediate pumped potential, $V_{CCI}$.

Subcircuit 50 comprises a second stage precharge circuit similar to the first stage precharge circuit The second stage precharge circuit comprises a level translator circuit 140, a common node 141, and transistors 145 and 150. Level translator circuit 140 is connected at a level translator circuit supply node 151 to output node 25. Since the potential of the output node 25 is the pumped potential and is greater than the intermediate pumped potential, when the logic signal L2 at node 81 goes high it is level translated from $V_{CCX}$ to $V_{CCP}$. This level translated potential actuates transistors 145 and 150. Therefore second stage nodes 105' and 95' are precharged to $V_{CCX}$ when L2 is high.

The $V_{CCI}$ generated by the first stage circuit 10 and equal to $2V_{CCX}-V_{T3}$ becomes the supply potential for a second stage level translator circuit 135. When the logic circuit generates the high active signal at node 80, level translating circuit 135 translates the high $V_{CCI}$ to second stage node 105' which has been precharged to $V_{CCX}$. Therefore the potential of second stage node 105' is equal to $3V_{CCX}-V_{T3}$. The $3V_{CCX}-V_{T3}$ actuates second stage transistor 70' passing the full value, $2V_{CCX}$, of the potential at second stage node 95' to output node 25. The pumped potential, $V_{CCP}$, at output node 25 is therefore equal to $2V_{CCX}$ as long as $3V_{CCX}-V_{T3}-V_{T4}$, where $V_{T4}$ is the threshold voltage of the second stage transistor 70', is greater than or equal to $2V_{CCX}$. For example if all of the $V_T$s of the circuit were equal to 1 volt the circuit would not function optimally below 2 volts.

Therefore even though $V_{CCX}$ may be decreased due to design considerations the pumped output potential is not decreased by the threshold voltage, and the pumped output potential at node 25 is large enough to allow the full charge of a storage capacitor to be passed to and from the storage capacitors of a DRAM. This is true even for small supply potentials less than 3 volts.

The generation of the pumped potential of the invention is efficient since the majority of current draw of the second stage circuit is supplied by $V_{CCX}$. Thus the first stage can have a small driving capacity since it is not loaded by the second stage.

An example may help the reader appreciate the advantages of the invention. Assume $V_{CCX}$ is equal to 2 volts and all $V_T$s are equal to 1 volt. When the logic circuit 46 responds to the oscillator signal the small 55 and large 65 pump capacitors of the first stage circuit 10 charge to twice $V_{CCX}$ or 4 volts. The 4 volt potential on the first stage small pump capacitor 55 actuates first stage transistor 70. Then the 4 volt potential stored on the first stage large pump capacitor 65 is coupled to the intermediate node 20 with a 1 volt loss due to the threshold potential of the first stage transistor 70, and the intermediate pumped potential is equal to 3 volts.

Now the intermediate pumped potential is level translated to second stage node 105' which is precharged to 2 volts. Therefore the potential of second stage node 105' is equal to 5 volts. Second stage node 95' is charged to twice $V_{CCX}$ or 4 volts. The 5 volts on second stage node 105' actuates second stage transistor 70' which then passes the 4 volts on second stage node 95' to output node 20 without a loss. Thus the pumped potential at node 25 is equal to 4 volts which is sufficient to actuate an access transistor and allow a full value of a potential stored or to be stored on a storage capacitor to pass through the access transistor.

Figure 4:
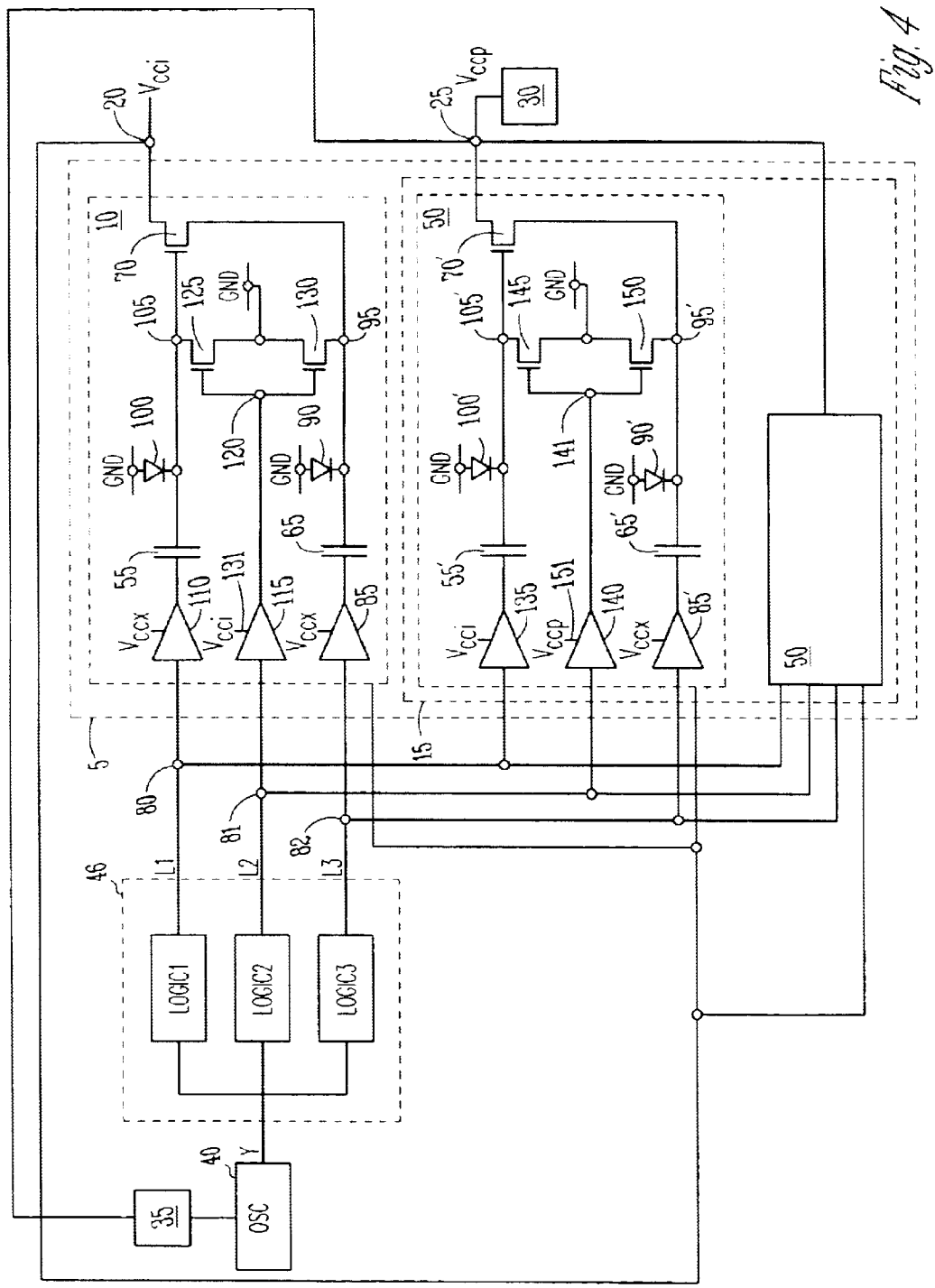
FIG. 4 is a schematic of a negative voltage pump.

Although the circuit has been shown for a circuit which generates a positive potential one skilled in the art will recognize that the invention is also applicable for a voltage pump which generates a negative potential. In this case each of the diodes in the circuit shown in FIG. 2 are reversed, and n-channel transistors are replaced with p-channel transistors. Nodes formerly connected to a positive supply potential are now connected to a ground reference potential. In addition the logic signals L1, L2, and L3 are inverted. See FIG. 4 for an example of a negative pump circuit of the invention.

Figure 5:
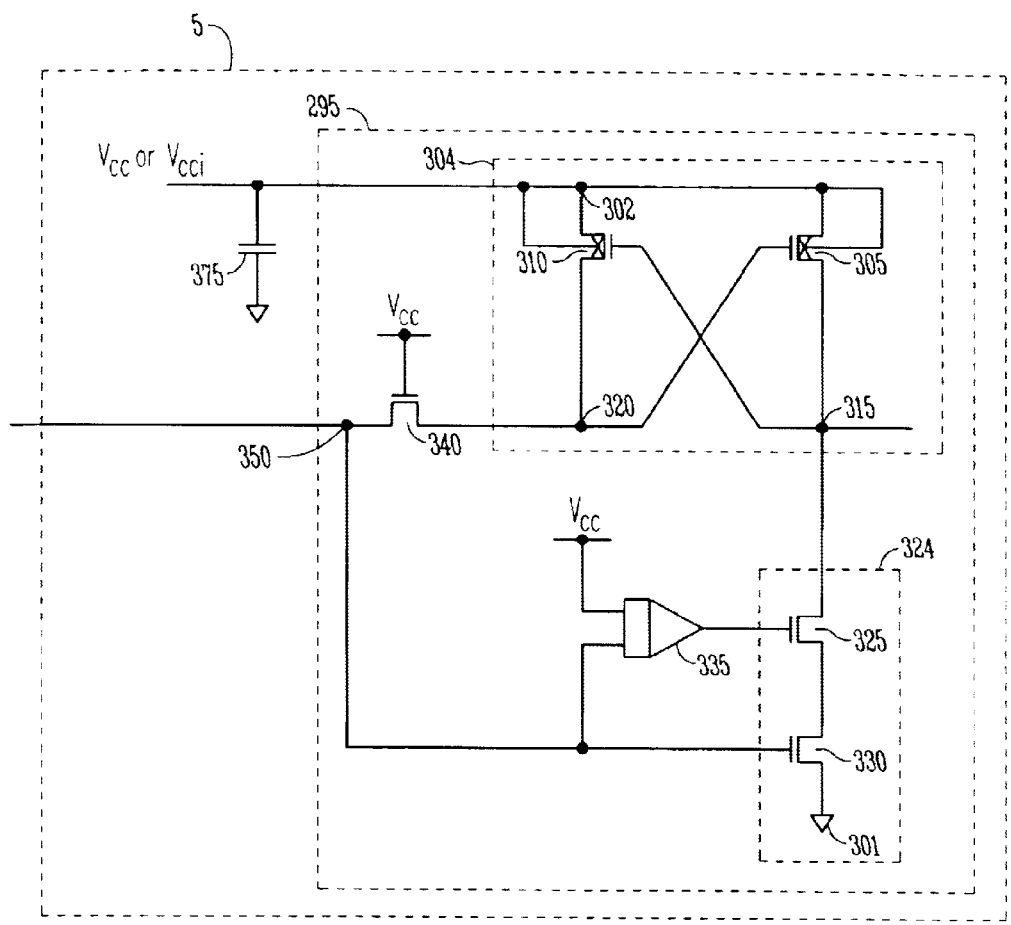
FIG. 5 is a schematic of one embodiment of the invention.

A further embodiment, shown in FIG. 5, is a level translator circuit configured to level translate a signal in the charge pump circuit shown in FIG. 2. The level translator circuits 115, 135, and 140 shown in FIG. 2 may be configured as the level translator circuit 295 of the invention shown in FIG. 5. When a signal is level translated its output potential is greater than the potential having the same logic state at the input of the level translator. This is accomplished by providing a pumped potential greater than a supply potential at a pumped supply node of the level translator circuit The level translator circuit of the invention reduces crossing current thereby increasing the efficiency of the charge pump circuit. Although the level translator circuit of the present embodiment is used in the charge pump circuit of the invention, it may be used to level translate signals in other types of circuits as well.

Referring again to FIG. 5, a periodic control signal, such as L1 or L2 of FIG. 2, controls the level translator circuit 295 at input node 350. The control signal transitions between a ground potential of zero volts and a supply potential of Vcc. The level translator circuit 295 is interposed between the ground potential at reference node 301 and a pumped potential, Vccp, greater than Vcc, at pumped supply node 302. When the level translator of this embodiment is used for circuit 135 of FIG. 2 Vccp is Vcci, the intermediate potential. The reference node can be thought of as a supply node connectable to supply potentials other than a supply potential equal to ground. A pull up portion 304 of the level translator circuit 295 comprises two cross coupled transistors 305 and 310. When the control signal at input node 350 is low, transistor 305 actuates, the output node 315 is coupled to the pumped supply node 302, and the potential of output node 315 is driven toward Vccp. The high output potential deactuates transistor 310 isolating node 320 from Vccp.

The pull down portion 324 of the level translator circuit comprises two NMOS transistors 325 and 330. When the control signal is low transistor 330 deactuates isolating output node 315 from the reference node 301.

When the control signal transitions high transistor 330 actuates, transistor 305 deactuates, and transistor 325 actuates after a time delay dependent on a delay element 335. The delay element 335 is designed to create a time delay which ensures that transistor 325 does not actuate until transistor 305 deactuates. A delay element is well known to those skilled in the art. When both transistors 325 and 330 are actuated output node 315 is pulled toward the ground potential through transistors 325 and 330. The low ground potential at node 315 actuates transistor 310 pulling node 320 toward Vccp which turns off transistor 340 when the control signal is high, thereby isolating node 320 from the input node 350.

Thus, the delay element 335 of the invention maintains the deactivation of the pull down portion 324 of the level translator circuit 295 until the pull up portion 304 of the level translator circuit 295 is deactivated. In other words the activation of the pull down portion 324 does not occur until the pull up portion 304 has been deactivated due to the delay element 335 delaying a gate control signal to transistor 325. Since the circuit of the invention prohibits the simultaneous activation of the pull up 304 and pull down 324 portions of the level translator circuit 295 crossing current and power consumption are reduced. Crossing current is current flowing between the pumped supply node 302 and the reference node 301.

A decoupling circuit 375 is interposed between the pumped supply node 302 and ground 301. In this embodiment the decoupling circuit 375 is a capacitor interposed between the pumped supply node 302 and ground 301. In this case the size of the decoupling capacitor is designed to be large enough to maintain the pumped potential at its maximum value regardless of current requirements of the translator circuit or charge pump circuit, thereby gaining head room on the charge pump circuit for a given Vcc and allowing a better boot for the pass gate to Vccp. In FIG. 2 the decoupling circuit is interposed between the intermediate node 20 and ground and/or the output node 25 and ground.

Figure 6:
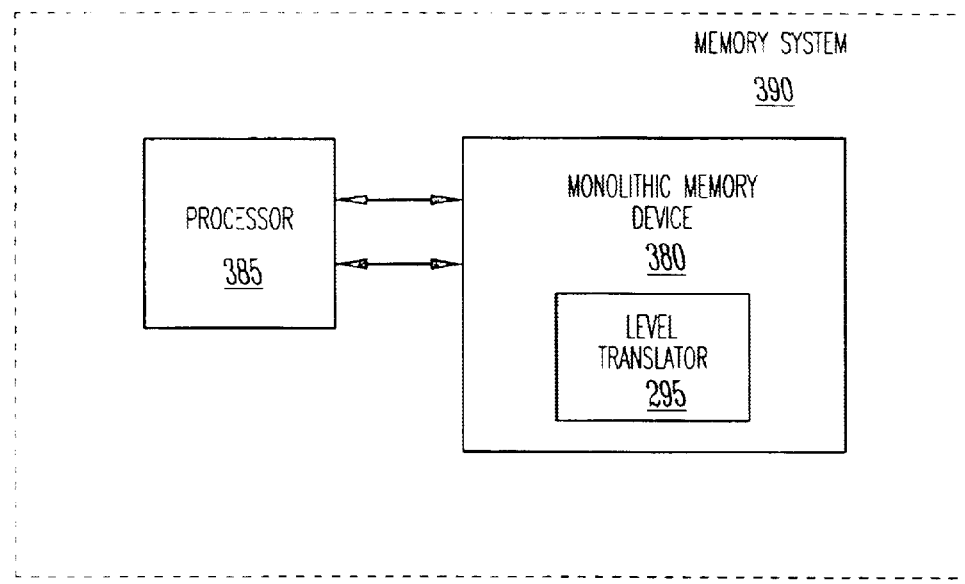
FIG. 6 is a block schematic of a memory system of the invention.

The level translator circuit 295 of the invention is typically used in a monolithic memory device 380, as shown in FIG. 6. The monolithic memory device 380 and a processor 385 form part of a memory system 390. The processor 385 is typically used to generate external control signals which access the monolithic memory device 380. The internal control signal at node 350 of level translator circuit 295 is generated in the monolithic memory device 380 in response to the external control signals.

Figure 7:
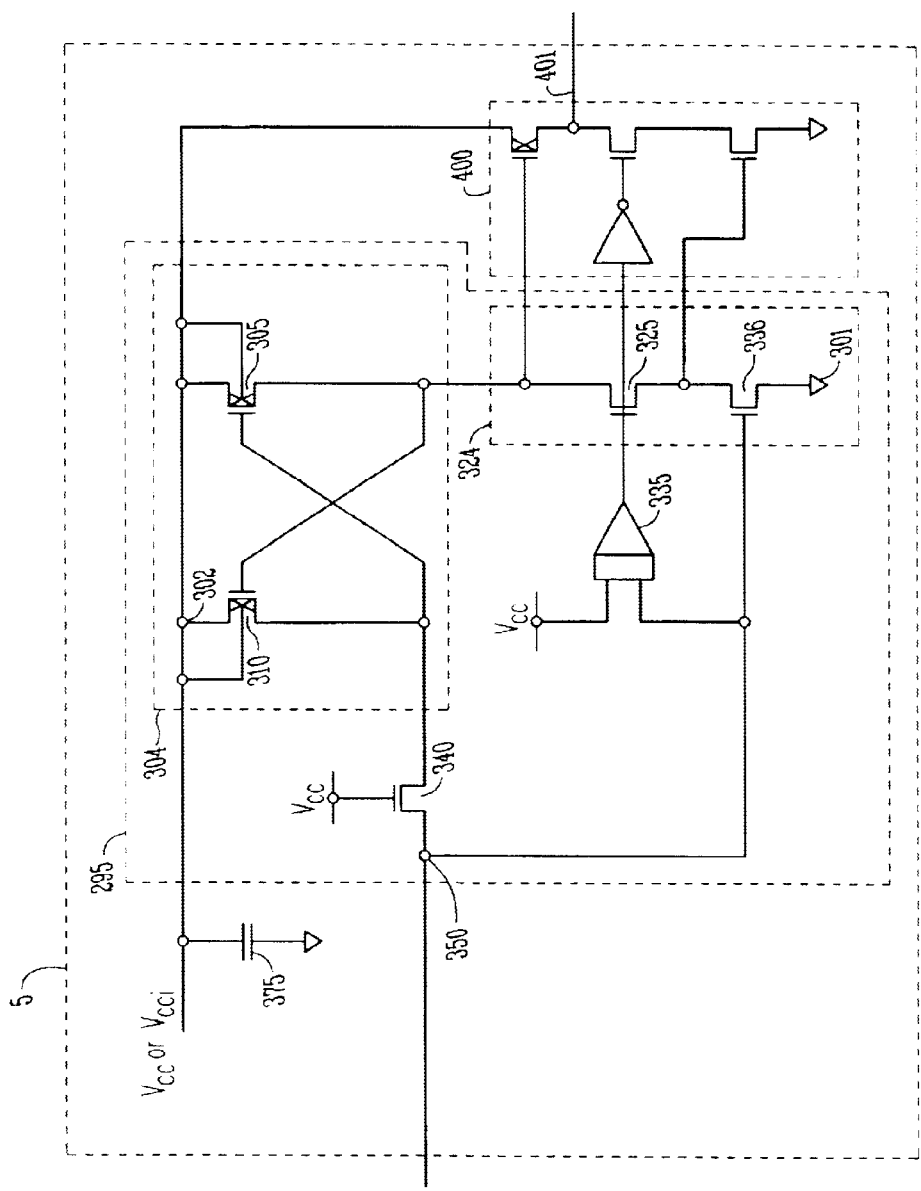
FIG. 7 is a schematic of a further embodiment of the invention.

In a further alternate embodiment, shown in FIG. 7, a further circuit 400 is used in conjunction with the circuitry of FIG. 5, to create a level translator circuit wherein the output signal, in this case at node 401, is not the inverse of the control signal, as is the case in the circuit of FIG. 5. Thus circuit 400 functions as a driver circuit which inverts a signal. Similar elements of FIGS. 5 and 7 are numbered the same.

Figure 8:
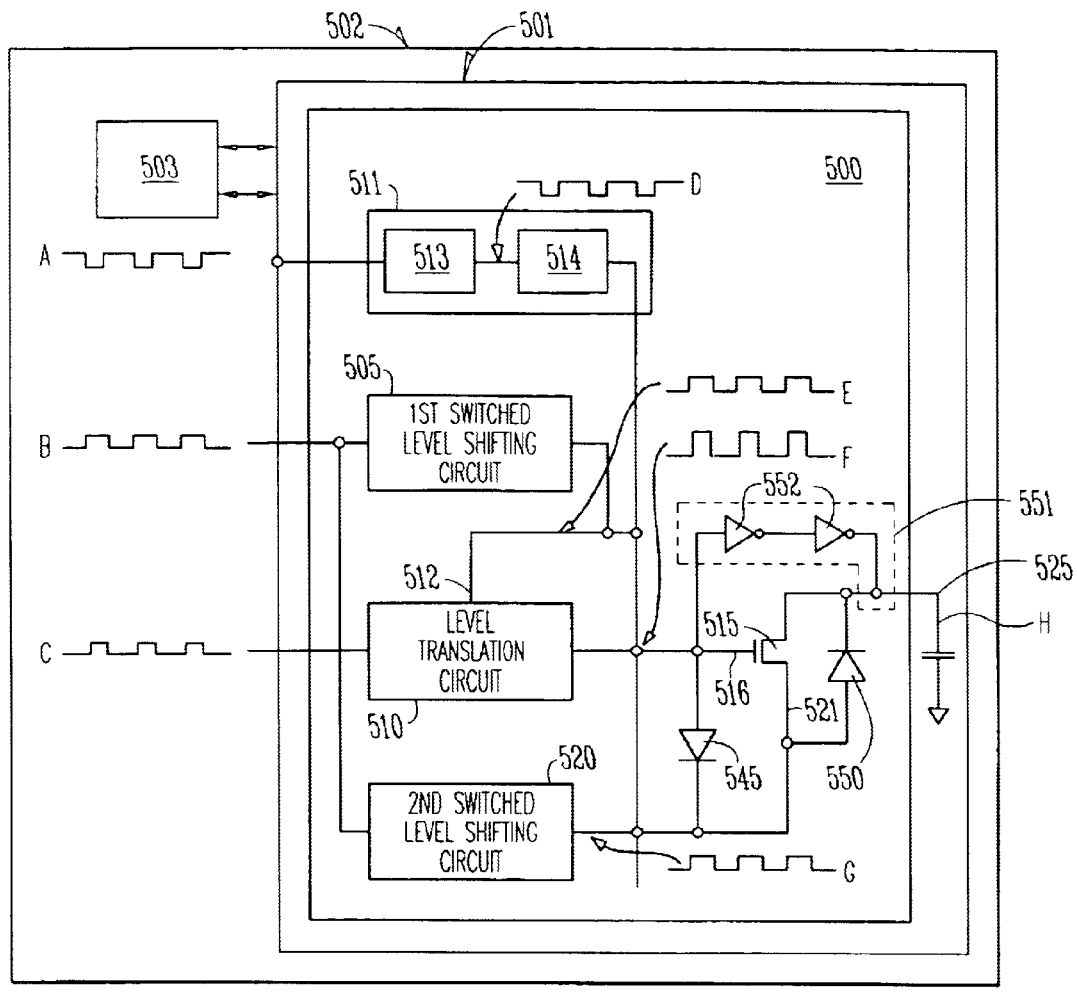
FIG. 8 is a block schematic of a further embodiment of a voltage pump of the invention.

The invention, as shown in FIG. 8, is a simplified high efficiency voltage pump circuit 500. The circuitry of a monolithic memory device 501, such as a dynamic random access memory device, may utilize the voltage pump circuit 500 of the invention. The monolithic memory device 501 may form a portion of a memory system 502 which comprises a processor 503 typically used to access the monolithic memory device 501. The memory system 502 comprises a first switched level shifting circuit 505 for supplying a periodic intermediate potential E as a supply potential to a level translator circuit portion 510 of the voltage pump circuit 500 in response to a periodic input signal B. Timing signals at input nodes, internal nodes, and an output node are shown and lettered in the schematic. The periodic intermediate potential E switches between 2Vcc and Vcc due to precharge circuit 511 precharging intermediate node 512 to Vcc. The precharge circuit 511 comprises a first portion 513 and a second portion 514. For purposes of this specification and claims, the maximum amplitude of a signal is equal to the absolute value of the greatest potential difference from a reference of 0 volts. In a second embodiment, not shown, where the precharge circuit is not used the periodic intermediate potential E switches between 2Vcc−Vt and Vcc−Vt, where Vt is a threshold voltage of a device within the first switched level shifting circuit 505. Referring again to FIG. 8, the level translator circuit portion 510 responds to a periodic input signal C which is a logic signal for controlling the actuation and deactuation of an n-channel pass transistor 515. The periodic input signal C and the periodic intermediate potential E are timed such that the input signal C is high for the portion of the time that the intermediate potential E is at 2Vcc, or 2Vcc−Vt for the second embodiment. The input signal C transitions low prior to the intermediate potential E transitioning to Vcc or Vcc−Vt. The invention provides an intermediate potential E without feedback loads and subsequent power loss.

The level translator circuit portion 510 provides a periodic pumped gate potential F, having a high potential equal to 3Vcc in the first embodiment, and 3Vcc−Vt in the second embodiment, to the gate 516 of the n-channel pass transistor 515. A second switched level shifting circuit 520 provides a periodic boosted potential G to the transistor terminal 521 in response to the periodic input signal B. The high potential of the periodic boosted potential G is approximately equal to 2Vcc, and the low potential is equal to Vcc. Thus, the high value of the gate potential F is large enough to pass the full high value of the boosted potential G to the output node 525 of the voltage pump circuit 500. Since the n-channel pass transistor 515 is only actuated when the boosted potential G is 2Vcc, the output potential H on output node 525 is a DC potential approximately equal to 2Vcc. With a large capacitive load the output potential remains fairly constant near 2Vcc or a lower value if a regulator (35 in FIGS. 1 and 2, for example) turns off the pump prior to the output reaching its full potential.

The periodic input potential E and the boosted potential G are also called level shifted periodic potentials. A level shifting circuit responds to an input signal having a plurality of first pulses and a plurality of second pulses, sometimes thought of as high and low pulses, to generate a level shifted signal having a plurality of first pulses and a plurality of second pulses whose potentials are shifted from a value of the potentials of the corresponding pluralities of first and second pulses of the input signal. The shift in potential can be positive or negative.

In the first embodiment, described in the preceding 2 paragraphs, the precharge circuit 511 precharges the intermediate node 512, the gate 516, and a transistor terminal 521 to Vcc. The precharge circuit 511 is explained more fully in the description of FIG. 9.

In still another embodiment of the circuit shown in FIG. 8, a diode clamp 545 is used to limit the gate potential F and the boosted potential G to within 1 threshold voltage (of the diode clamp) of each other. Since the boosted potential G reaches 2Vcc prior to the gate potential F reaching 2Vcc the diode clamp 545 turns on only when the gate potential F is unnecessarily high. A second diode clamp 550 is connected between the transistor terminal 521 and the output node 525 so that the boosted potential G does not need to climb above the output potential H plus a Vt of diode clamp 550. This in turn limits the gate potential F through diode clamp 545. Alternately a third diode clamp 551, shown by dashed lines, may be used in place of the first 545 and the second 550 diode clamps. Third diode clamp 551 is comprised of two serially connected diodes 552 interposed between gate 516 and output node 525. In a preferred embodiment the two diodes 552 are transistors configured as diodes. The third diode clamp 551 clamps the gate potential at node 516 and the output potential at output node 525 to within a clamp circuit threshold voltage of each other.

Figure 9:
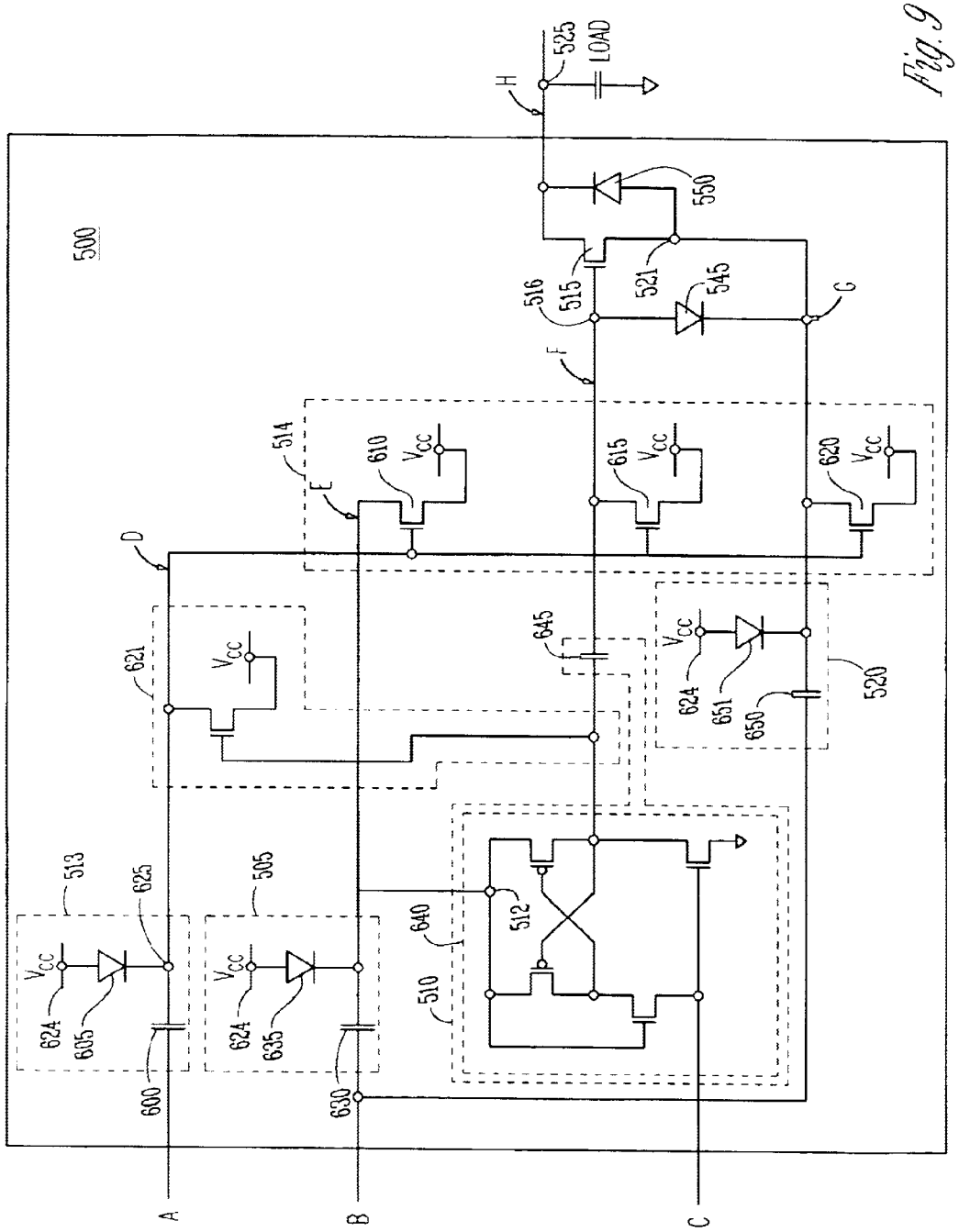
FIG. 9 is a detailed schematic of the circuit of FIG. 8.
Figure 10:
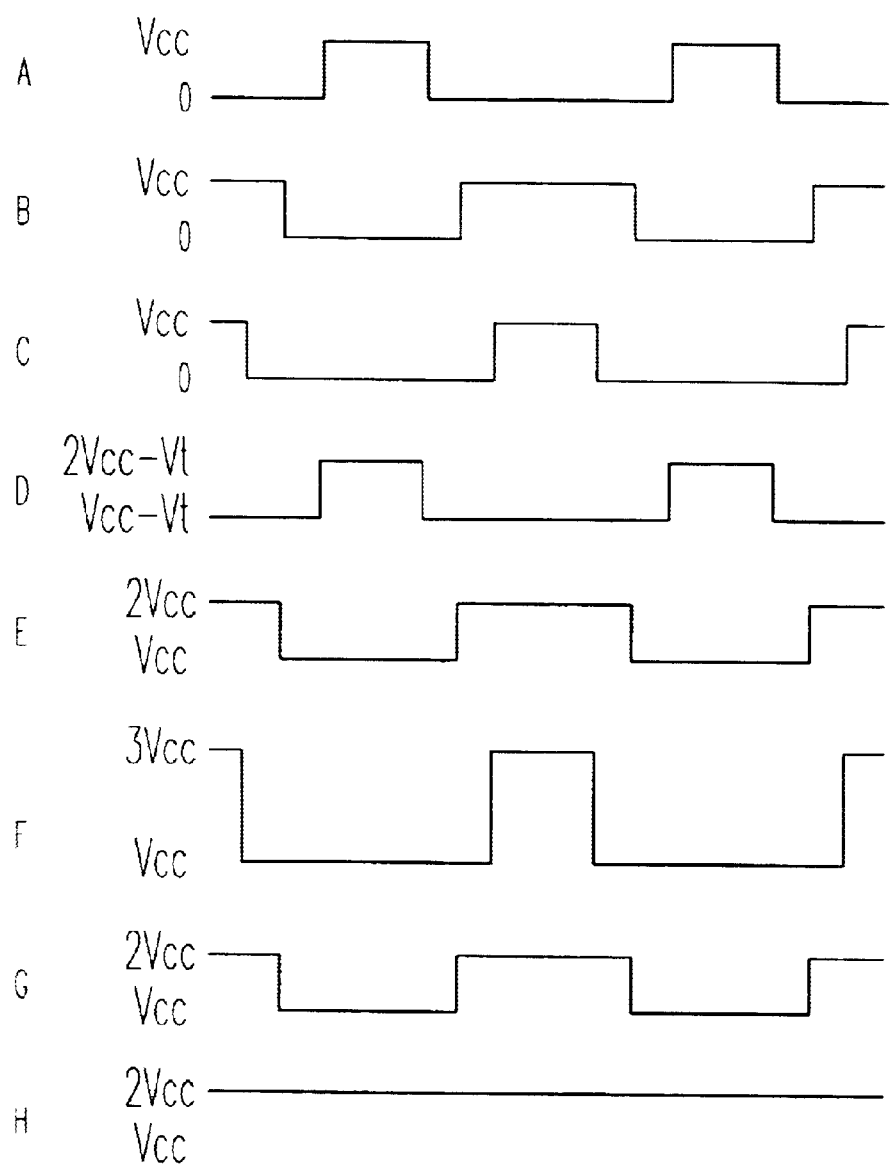
FIG. 10 is a timing diagram of input signals, internal signals, and the output signal of the invention shown in FIG. 8.

FIG. 9 is a detailed schematic of the block diagram of the invention shown in FIG. 8 and can best be understood when studied in conjunction with the timing diagram of FIG. 10 which depicts the relationship of the input signals to the circuit shown in FIG. 9, the internal signals generated in the circuit of FIG. 9 in response to the input signals, and the output signal of the circuit shown in FIG. 9.

Precharge circuit 513 comprises a small capacitor 600, diode 605 in the first portion 513, and transistors 610, 615, and 620 in the second portion 514. In an optional embodiment, a further precharge circuit 621 precharges node 625 toward Vcc when actuated by the high value of the output potential of buffer circuit 640. The diode 605 is interposed between a supply node 624 connected to a supply potential and node 625. The diode holds the low potential of node 625 to Vcc−Vt, where Vt is the threshold voltage of diode 605. A transition of the potential of signal A from 0 Volts to Vcc results in a transition of the potential at node 625 from Vcc−Vt to 2Vcc−Vt. This potential of 2Vcc−Vt actuates transistors 610, 615 and 620 driving the potentials of the sources of the transistors 610, 615, and 620 toward Vcc. Transistors 610, 615, and 620 are connected to supply node 624 at their drains.

First switched level shifting circuit 505 comprises a small capacitor 630 and a diode 635 connected to supply node 624. The diode is typically useful during start up to precharge the intermediate node 512 to Vcc−Vt, where Vt is the threshold voltage of diode 635. Since the intermediate node 512 is precharged to Vcc by the precharge transistor 610, capacitor 630 charges the intermediate node to 2Vcc when the input signal B is high. Thus the intermediate potential E at the intermediate node 512 is a periodic signal having a low potential of Vcc and a high potential of 2Vcc.

Level translator circuit portion 510 comprises a buffer circuit 640 and a small capacitor 645. The periodic intermediate potential E is a supply potential to buffer circuit 640. The precharge transistor 615 precharges the small capacitor 645 to Vcc, and the buffer circuit translates the periodic input signal C to its output as a periodic output signal having a low potential of zero volts and a high potential of 2Vcc, because the supply potential to buffer circuit 640 has a high potential of 2Vcc. The small capacitor 645 couples a potential from buffer circuit 640 to gate 516 in response to the periodic signal C thereby creating a periodic gate potential F at node 516. The periodic gate potential F has a high potential of 3Vcc and has a low potential of Vcc.

The second switched level shifting circuit 520 comprises a large capacitor 650 which is precharged to Vcc by transistor 620 and a precharge diode 651. The amplitude, Vcc, of periodic input signal B is coupled through the large precharged capacitor. Thus the potential at transistor terminal 521 of transistor 515 is a periodic signal G having 2Vcc as a high potential and Vcc as a low potential. The high potential of periodic gate signal F actuates transistor 515 when periodic signal G is high and the high potential, 2Vcc, is driven to output node 525 without loss since the gate potential is at least one threshold potential of the transistor 515 greater than the high potential at transistor terminal 521. Since there is typically a large capacitive load connected at output node 525 the output potential Vccp is essentially a DC potential of approximately 2Vcc.

Figure 11:
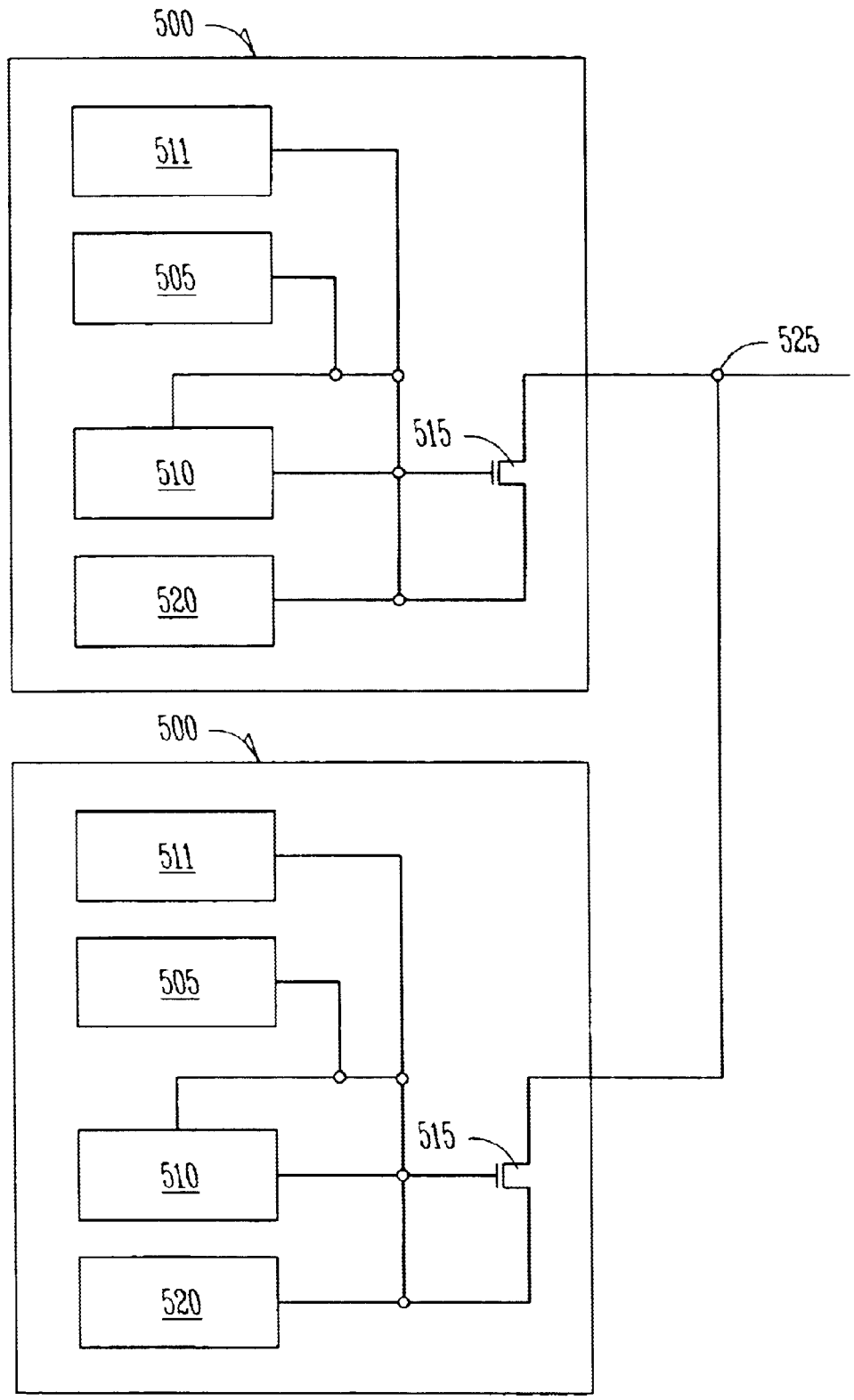
FIG. 11 is a block schematic of a further embodiment of the invention.

In one preferred embodiment of the invention, multiple voltage pump circuits 500 may be used in parallel to drive the pumped potential to the output node 525, see FIG. 11. In this case the pass transistor 515 for each voltage pump circuit 500 is connected to the output node 525. The input signals to the multiple voltage pump circuits 500 may be out of phase with each other in order to actuate the multiple pass transistors 515 at alternate times. In one preferred embodiment the phase shift is 180 degrees. Thus, by using multiple voltage pump circuits 500 the potential at output node 525 is driven toward the pumped potential more frequently than if only one voltage pump circuit was used. Therefore by using multiple voltage pump circuits 500 the ripple of the pumped output potential can be reduced even in a case of a large current load at output node 525. Although two voltage pump circuits 500 have been shown in FIG. 11, more may be used.

In an alternate embodiment, the voltage pump shown in FIGS. 9 and 10 is a negative pump. In this case each of the diodes in the circuit shown in FIG. 9 are reversed, and n-channel transistors are replaced with p-channel transistors. The ground reference node shown in buffer circuit 640 of FIG. 9 becomes the intermediate supply node and accepts the periodic intermediate potential which now transitions between −Vcc and 0 volts. In addition the logic values of input signals A, B, and C are reversed. See FIG. 12 for an example of a negative pump circuit of the invention.

Figure 12:
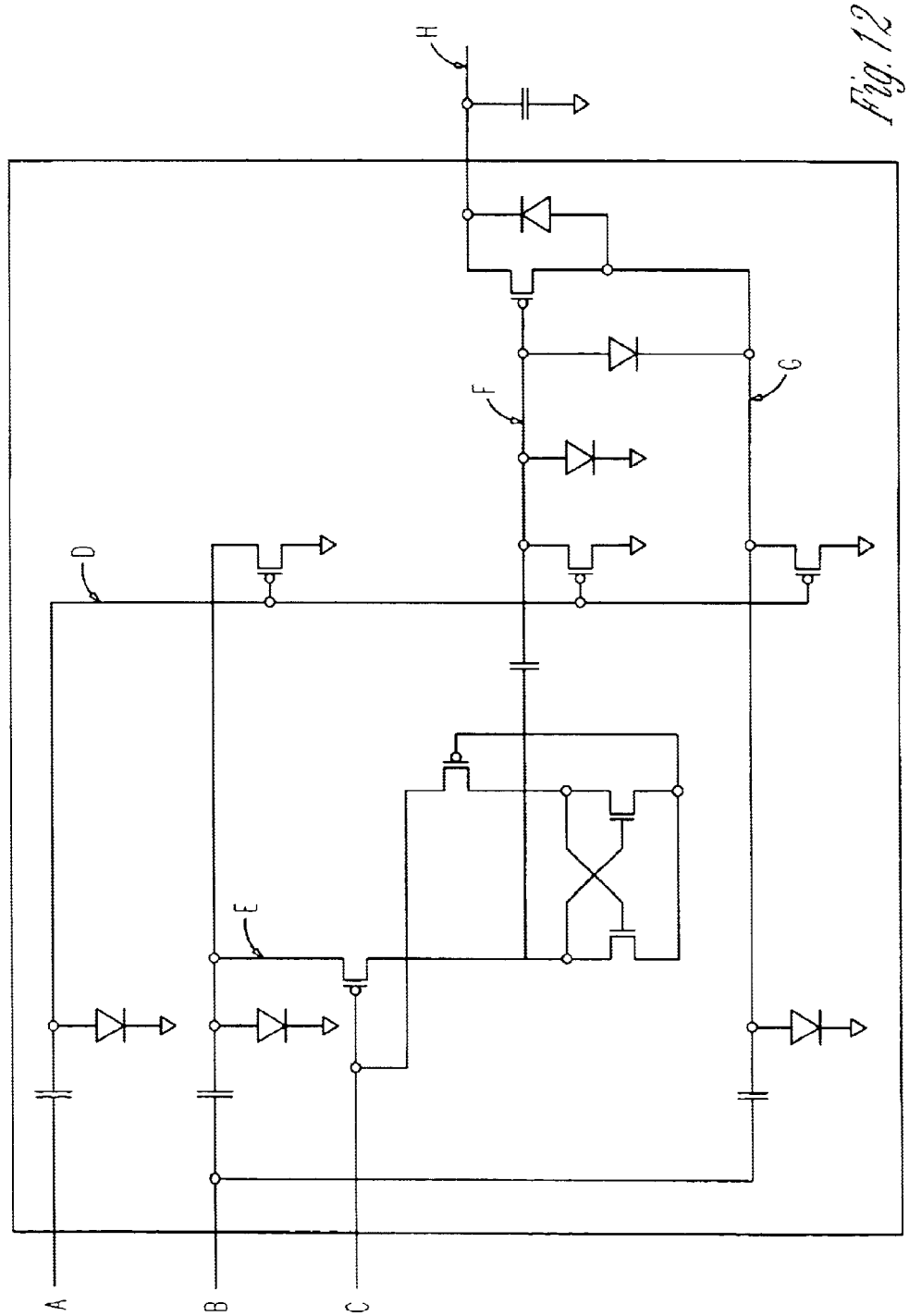
FIG. 12 is a schematic of an alternate embodiment of the invention.
Figure 13:
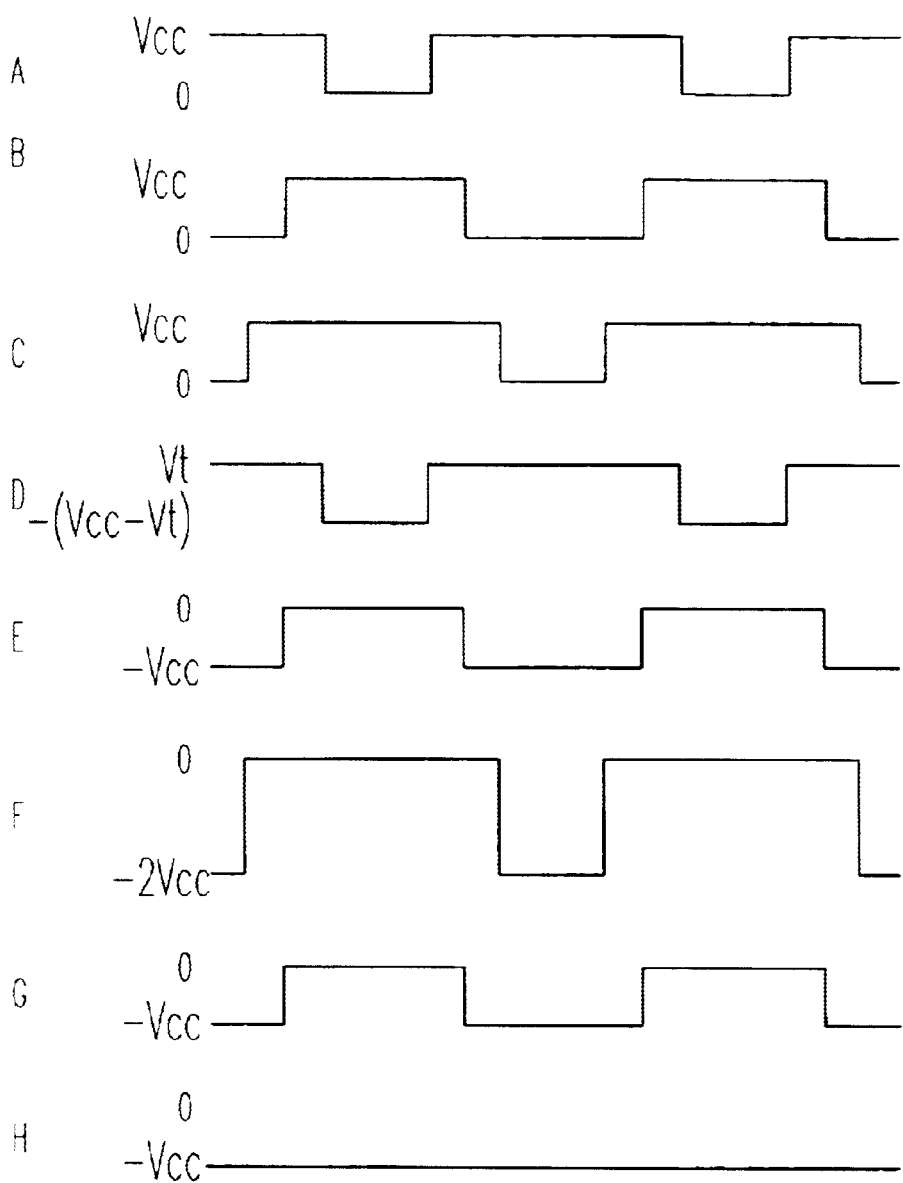
FIG. 13 is a timing diagram of input signals, internal signals, and the output signal of the invention shown in FIG. 12.

FIG. 13 is a timing diagram of input signals, internal signals, and the output signal of the invention shown in FIG. 12. Output H of FIG. 13 may be limited to a value greater than Vcc by a voltage regulator configured like regulator 35 of FIGS. 1 and 2. Typically, in an integrated circuit application, output H of the negative pump is regulated to approximately −1 Volt.

Figure 14:
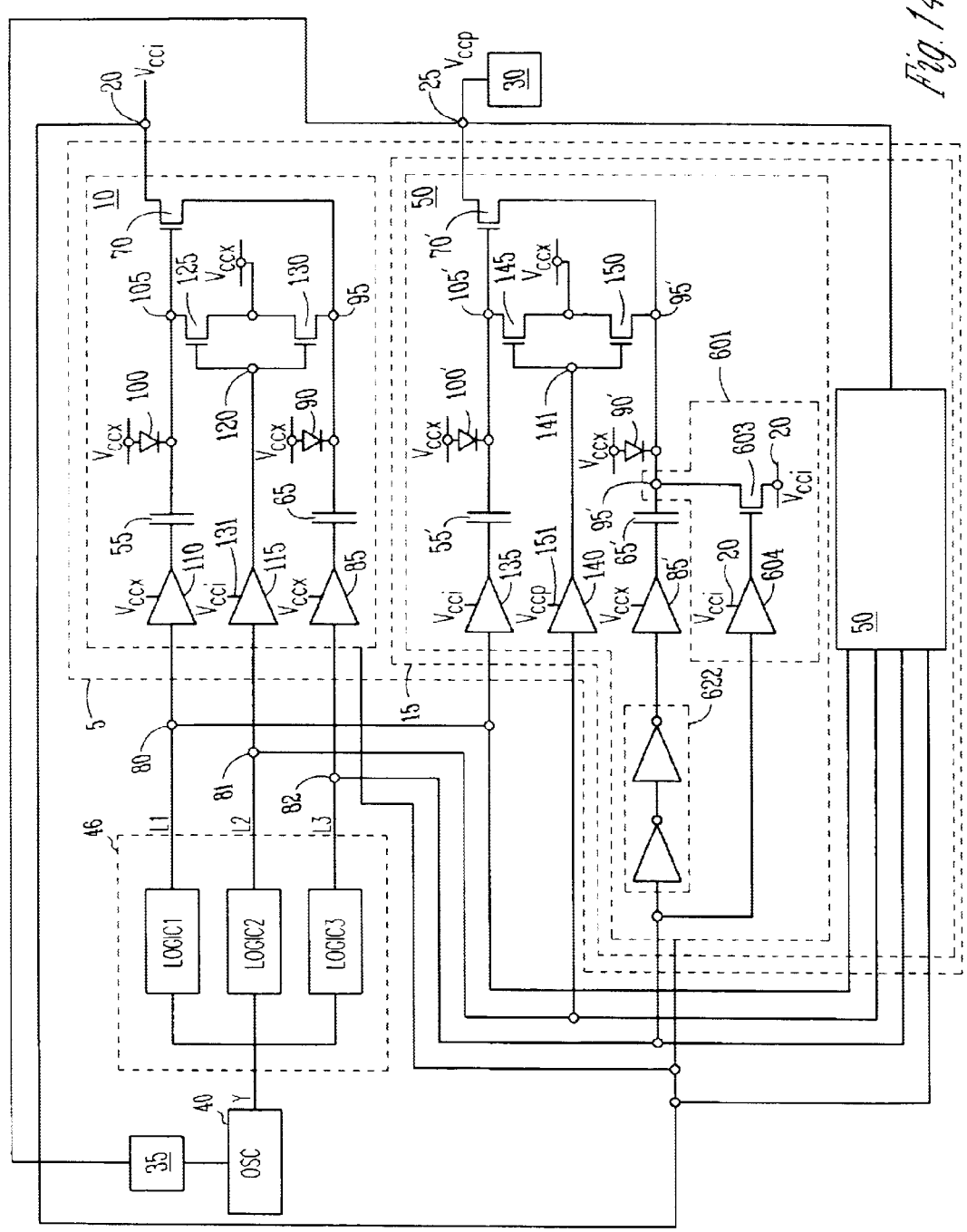
FIG. 14 is a schematic of a precharge circuit of the invention.

A further exemplary embodiment of the invention is shown in FIG. 14. Components which are the same as those in FIG. 2 are numbered the same. For exemplary purposes it is assumed the designer uses components having the same threshold voltage throughout the circuit. By using a further precharge circuit 601 of the invention the boosted potential at node 95' and the actuation or control potential at node 105' dynamically adjust according to the load seen by the two nodes. Due to the dynamic adjustment the control potential of node 105' is 1 threshold voltage (of the precharge circuit) greater than the boosted potential at node 95'. By designing the precharge circuit 601 to have a threshold voltage equal to the threshold voltage of transistor 70' the full value of the boosted potential may be passed to the output node 25. As long as the control potential is at least one transistor threshold voltage greater than the output potential, the precharge circuit 601 allows the excess charge of the intermediate potential to be passed to the output node 25. It is undesirable to have an excessively high control potential since circuit damage can occur. By coupling the excess charge from node 105' to node 95', excess control potential is eliminated, and additional charge is available on node 95'. Since the difference between the boosted and output potential is increased, and since charge is proportional to the capacitance of capacitor 65' times the difference between the boosted potential and the output potential, additional charge is passed to the output node 25.

The further precharge circuit 601 of a first embodiment comprises a transistor 603 interposed between the intermediate node 20 and node 95'. After initial start up the potential of the intermediate node 20 is equal to 2Vccx−Vt. Transistor 603 is gated by a potential from a buffer circuit 604 which is controlled by logic signal L3 generated at node 82. The intermediate potential is the supply potential to buffer circuit 604. Thus the intermediate potential is buffered to the gate of transistor 603 and actuates transistor 603 to precharge node 95' to the intermediate potential minus a Vt of transistor 603, Vcci−Vt. Substituting the ideal value of Vcci, the precharge potential is 2Vccx−2Vt. However the circuit is not ideal. The circuit is dynamic, and the actual value of the intermediate potential is dependent on the load. However at any point in time the precharge circuit charges node 95' to Vcci–Vt, where Vcci is the instantaneous intermediate potential. Buffer circuit 85' increases the potential of node 95' by Vccx in response to a delayed signal L3 from logic circuitry 46. L3 is delayed in delay circuit 622 comprised of two serially connected inverters. Thus, the total boosted potential of node 95' is equal to Vccx+Vcci–Vt, or ideally 3Vccx–2Vt. Due to the precharge circuit the potential at node 105' varies with respect to node 95'. However the difference in potentials of node 105' and 95' remains at 1 Vt of the precharge circuit, and the entire boosted potential at node 95' may be driven to output node 25 through transistor 70'. By using the precharge circuit 601 of the invention the excess potential on the intermediate node is used to precharge the main charge source, capacitor 65', above Vccx to make the pump more efficient.

Figure 15:
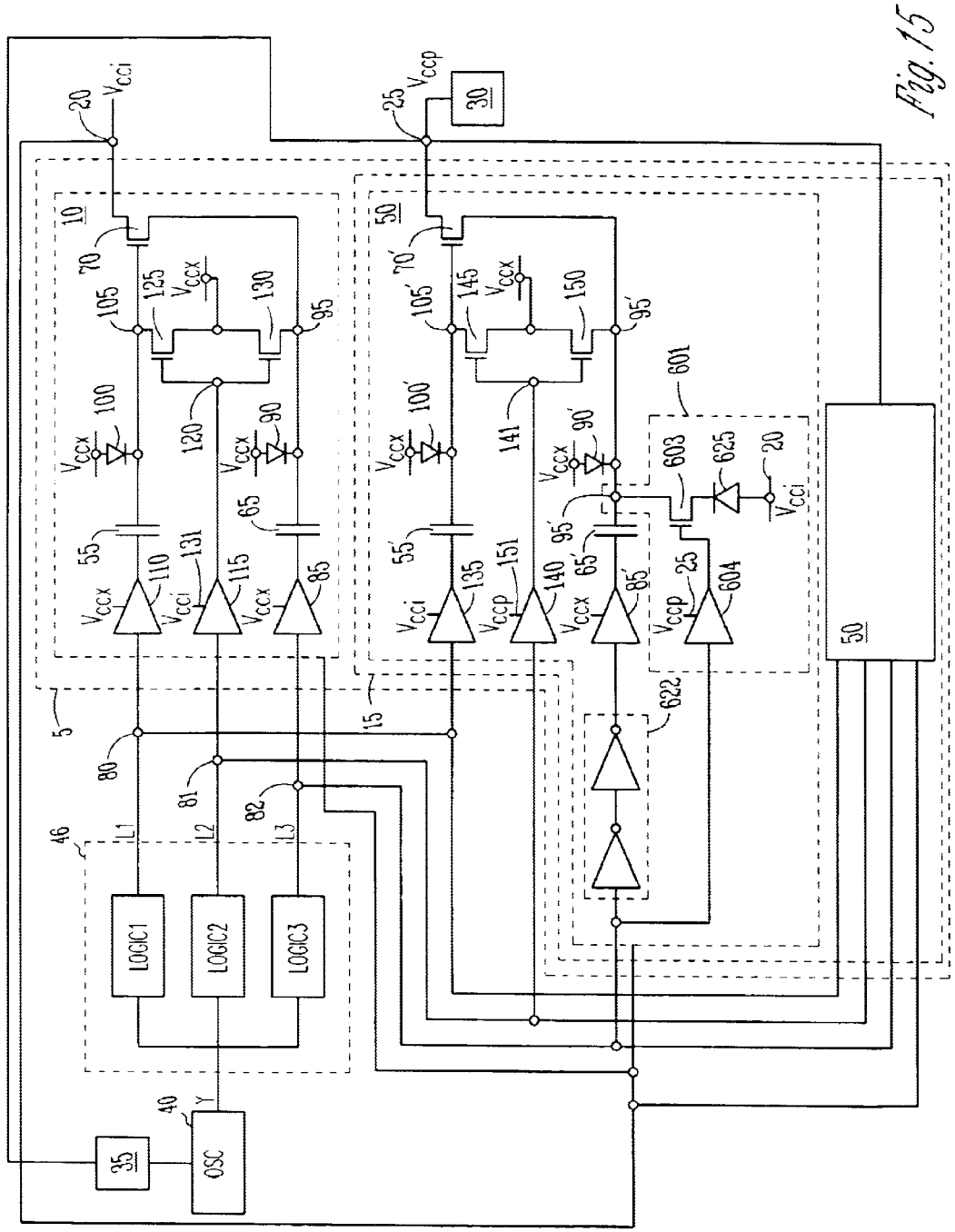
FIG. 15 is a schematic of a precharge circuit of the invention.

In a second embodiment a diode 625 is serially interposed between intermediate node 20 and transistor 603, see FIG. 15. Therefore in either the first or the second embodiments precharge circuit 601 ideally precharges node 95' to 2Vccx–2Vt, or controls the potentials of nodes 105' and 95' to be within 1 threshold voltage, of the precharge circuit, of each other.

For example, when Vccx is 3V, the intermediate potential is initially approximately 6V–1Vt or approximately 5V. By using the intermediate potential instead of Vccx through diode 90 to precharge node 95', node 95' can be precharged to between 3 and 4 volts without reducing the potential of the intermediate node 20 to less than Vccx plus 1Vt. By precharging node 95' above 3V, the output potential, Vccp, can attain a value which is greater than 2Vccx. The maximum output potential now becomes (Vcci–1Vt)+Vccx which is approximately equal to 7 Volts or 3Vccx–2Vt, which is clearly greater than 2Vccx. In operation, Vccp will not go above 2Vccx because the regulator 35 typically shuts off the pump before this occurs, however passing more charge to Vccp from the pump will make the pump more efficient.

This method should work down to about a 2V Vccx where 2Vccx–1Vt is approximately equal to Vccx+1Vt, assuming 1Vt is approximately equal to 1 Volt For other threshold values the circuit will work until 2Vccp–1Vt is approximately equal to Vccx+1Vt. For higher Vccx levels, say 5V, the intermediate voltage will possibly achieve a value of approximately 13V unless it is limited in some way (a two diode series clamp to Vccp for example). In this case, the 2Vccx node can be precharged to between 4 and 8 V or the clamped intermediate voltage minus 1Vt. The precharge voltage will be dependent on the ratio of the capacitors in the first stage circuit 10 versus the capacitance in the subcircuit 50 of the pump. The precharge voltage plus Vccx is the maximum Vccp.

Figure 16:
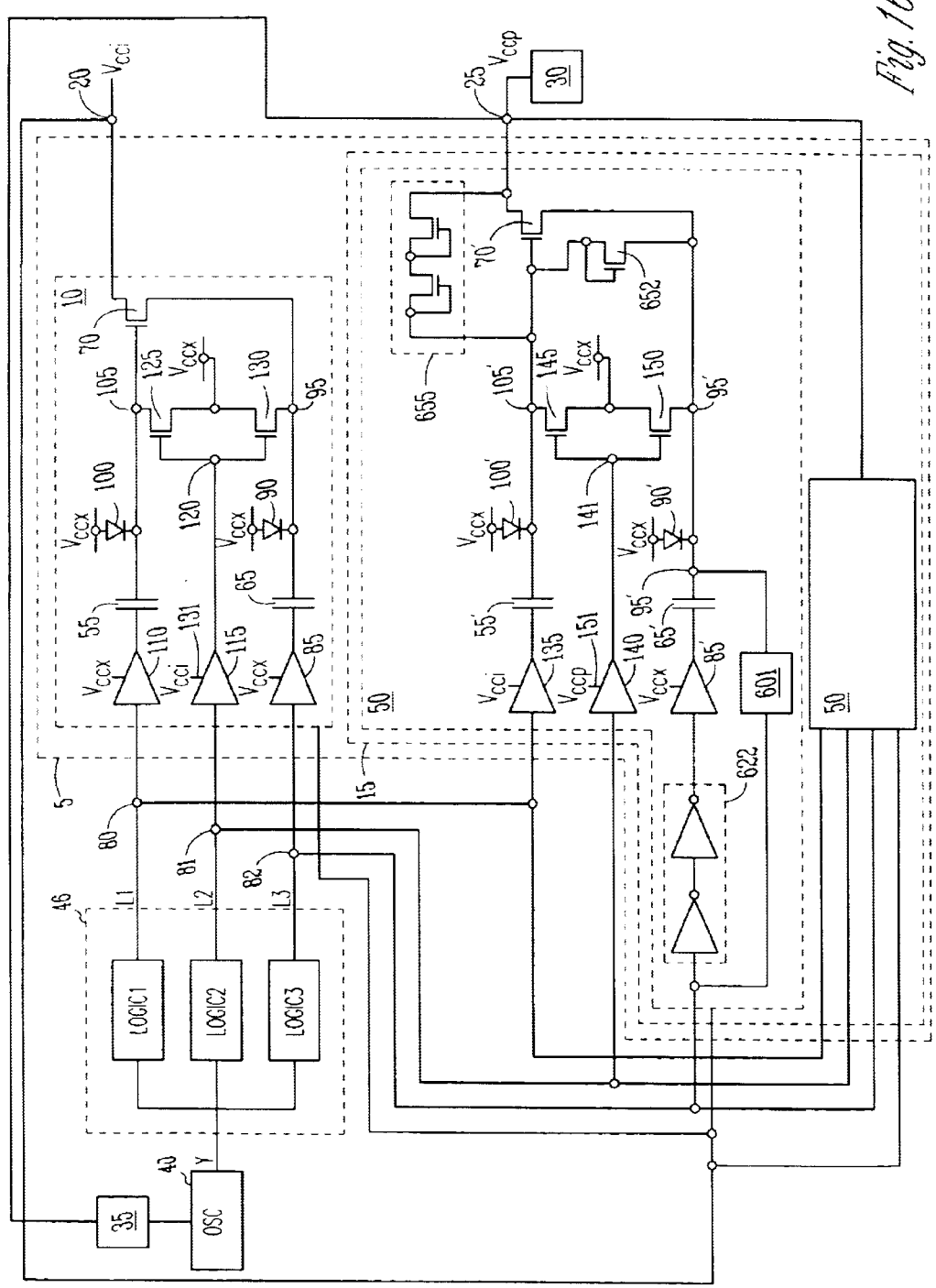
FIG. 16 is a schematic of a further embodiment of the invention.
Figure 17:
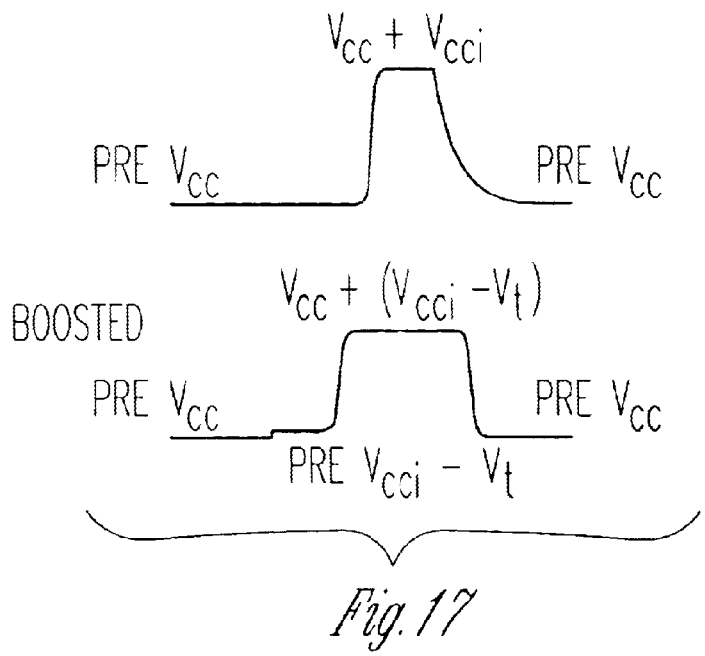
FIG. 17 is a schematic of the control potential and boosted potential generated in the circuit shown in the schematic of FIG. 16.

Alternate embodiments of the invention are shown in FIG. 16. In a first alternate embodiment a transistor configured as a diode 652 (or two serially connected diodes, not shown) is connected between node 105' and node 95' to bootstrap or clamp the boosted potential at node 95' to within a threshold voltage of diode 652 (or the total threshold voltage of the two serially connected diodes) of the control potential at node 105' when the control potential is greater than one threshold voltage above the output potential at node 25. Referring to the timing diagram shown in FIG. 17 it can be seen that as the control potential transitions to the threshold voltage the boosted potential transitions to zero volts. In addition diode 652 may be used with the precharge circuit 601 of the invention In the second embodiment, shown as dashed lines in FIG. 16, two serial connected transistors are configured as diodes 655 and are connected between node 105' and output node 25. Diodes 655 bootstrap or clamp the output potential to within a threshold voltage of the control potential and may be used in conjunction with the precharge circuit 601.

Figure 18:
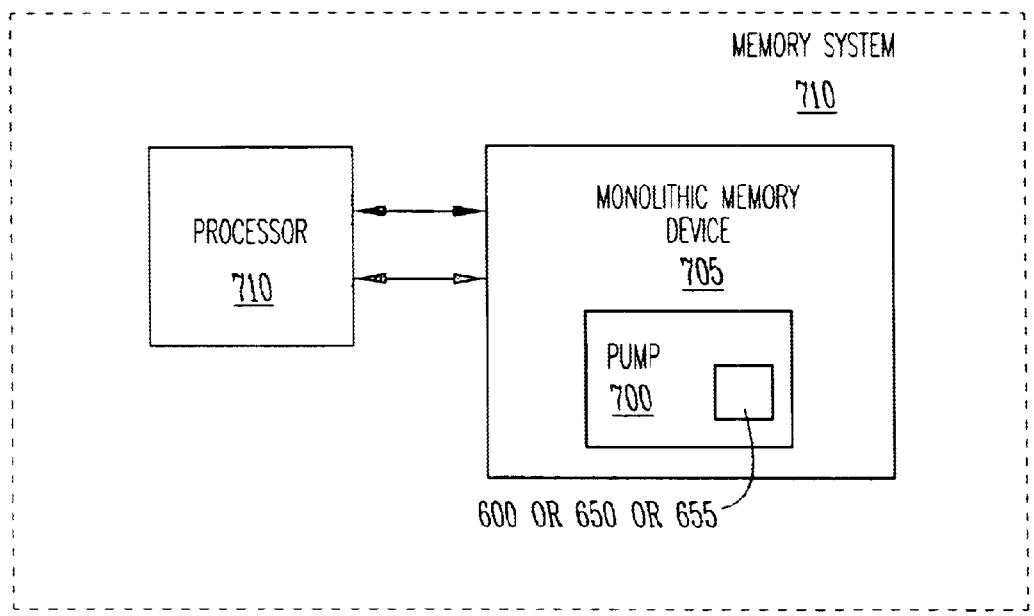
FIG. 18 is a block schematic of a memory system of the invention.

The pump circuit 700 comprising the precharge circuit 601, diode 652, diodes 655, or a disclosed combination thereof is typically used in a monolithic memory device 705, such as a dynamic random access memory device, as shown in FIG. 18. The monolithic memory device 705 and a processor 710 form part of a memory system 715. The processor 710 is typically used to generate external control signals which access the monolithic memory device 705, either directly or through a memory controller (not shown).

While the invention has been particularly shown and described herein with reference to a preferred embodiment thereof, it will be understood by those skilled in the art that various other modifications and changes may be made to the present invention from the principles of the invention described above without departing from the spirit and scope thereof as encompassed in the accompanying claims. Therefore, it is intended that the appended claims cover all such equivalent variations as may come within the scope of the invention as described.

What is claimed is:

1. A level translator electrically interposed between a pumped supply node connectable to a pumped supply potential and a reference node connectable to a reference potential, comprising:
   a decoupling circuit electrically interposed between the pumped supply node and the reference node, the decoupling circuit configured to substantially maintain a maximum value of the pumped supply potential at the pumped supply node;
   a pull up circuit operably coupled to the pumped supply node, the pull up circuit also coupled to a first control node and selectively operable in response to a first control signal at the control node;
   a pull down circuit operably coupled to the pull up circuit and to a second control node, the pull down circuit selectively operable in response to a second control signal at the second control node; and
   an intermediate circuit operably coupled to at least one of the pull up circuit and the pull down circuit and responsive to at least one of said first and said second control signals to substantially preclude simultaneous actuation of said pull up circuit and said pull down circuit.

2. The level translator of claim 1, wherein the decoupling circuit includes a capacitor electrically interposed between the pumped supply node and the reference node.

3. The level translator of claim 1, wherein the reference node is connectable to a reference potential of ground.

4. A level translator circuit electrically interposed between a pumped supply node connectable to a pumped supply potential and a reference node connectable to a reference potential, comprising:
   a decoupling circuit electrically interposed between the pumped supply node and the reference node, the decoupling circuit configured to substantially maintain a maximum value of the pumped supply potential at the pumped supply node;
   a pull up circuit operably coupled to the pumped supply node, the pull up circuit also coupled to a first control node and selectively operable in response to a first control signal at the control node;
   a pull down circuit operably coupled to the pull up circuit and to a second control node, the pull down circuit selectively operable in response to a second control signal at the second control node; and an intermediate circuit operably coupled to at least one of the pull up circuit and said pull down circuit and responsive to at least one of said first and said second control signals to substantially preclude simultaneous actuation of said pull up circuit and said pull down circuit, wherein the intermediate circuit comprises an isolation circuit controlled in response to a delayed second control signal.

5. A level translator circuit electrically interposed between a pumped supply node connectable to a pumped supply potential and a reference node connectable to a reference potential, comprising:

a decoupling circuit electrically interposed between the pumped supply node and the reference node, said decoupling circuit configured to substantially maintain a maximum value of the pumped supply potential at the pumped supply node;

a pull up assembly coupled to operably coupled to the pumped supply potential and to an output node and configured to raise a potential at said output node in response to a first control signal;

a pull down assembly coupled to a relatively lower potential than said pumped supply potential and to said output node and configured to lower the potential at said output node in response to a said second control signal; and a delay assembly coupled to at least one of said pull up assembly and said pull down assembly and placed to interpose a delay between actuation states of said pull up and pull down assemblies, wherein the delay assembly comprises an isolation circuit between the pull up and pull down circuits in order to isolate the pull up and pull down circuits in response to either a delayed first or second control signal.

6. A level translator electrically interposed between a pumped supply node connectable to a pumped supply potential and a reference node connectable to a reference potential, comprising:

a decoupling circuit connected between the pumped supply node and the reference node, said decoupling circuit configured to substantially maintain a maximum value of the pumped supply potential at the pumped supply node;

a first circuit configured to respond to a periodic input potential and configured to accept a periodic supply potential, said first circuit configured to generate a first periodic output potential;

a second circuit configured to respond to said periodic input potential and configured to accept said first periodic output potential and said periodic supply potential, said second circuit configured to generate a second periodic output potential, wherein a maximum amplitude of the first periodic output potential is substantially equal to a maximum amplitude of the periodic supply potential; and a precharge circuit configured to generate a periodic precharge potential, said second circuit precharged in response to the periodic precharge potential, wherein a maximum amplitude of the second periodic output potential is substantially equal to a sum of a maximum amplitude of the periodic supply potential and the periodic precharge potential.

7. A level translator circuit electrically connected between a pumped supply node and a reference node, comprising:

a decoupling circuit electrically connected between the pumped supply node and the reference node, said decoupling circuit configured to substantially maintain a maximum value of the pumped supply potential at the pumped supply node;

a first circuit configured to respond to a periodic input potential and configured to accept a periodic supply potential, said first circuit configured to generate a first periodic output potential;

a second circuit configured to accept said first periodic output potential and to generate a second periodic output potential, wherein a maximum amplitude of the first periodic output potential is substantially equal to a maximum amplitude of the periodic supply potential; and a precharge circuit configured to generate a periodic precharge potential, said second circuit precharged in response to the periodic precharge potential, wherein a maximum amplitude of the second periodic output potential is substantially equal to a sum of a maximum amplitude of the periodic supply potential and the periodic precharge potential.

8. A level translator circuit electrically connected between a pumped supply node and a reference node, comprising:

a decoupling circuit electrically connected between the pumped supply node and the reference node, said decoupling circuit configured to substantially maintain a maximum value of the pumped supply potential at the pumped supply node;

a first circuit configured to respond to a periodic input potential and configured to accept a periodic supply potential, said first circuit configured to generate a first periodic output potential;

a second circuit configured to accept said first periodic output potential and to generate a second periodic output potential; and a precharge circuit configured to generate a periodic precharge potential, said second circuit precharged in response to the periodic precharge potential, wherein a maximum amplitude of the second periodic output potential is substantially equal to a sum of a maximum amplitude of the periodic supply potential and the periodic precharge potential.

9. A level translator circuit electrically connected between a pumped supply node and a reference node, comprising:

a decoupling circuit electrically connected between the pumped supply node and the reference node, said decoupling circuit configured to substantially maintain a maximum value of the pumped supply potential at the pumped supply node;

a first circuit configured to respond to a periodic input potential and configured to accept a periodic supply potential, said first circuit configured to generate a first periodic output potential;

a second circuit configured to accept said first periodic output potential and to generate a second periodic output potential;

a precharge circuit configured to generate a periodic precharge potential, said second circuit precharged in response to the periodic precharge potential wherein a maximum amplitude of the second periodic output potential is substantially equal to a sum of a maximum amplitude of the periodic supply potential and the periodic precharge potential; and a further precharge circuit in electrical communication with said precharge circuit, a control node of said further precharge circuit in electrical communication with an output node of said first circuit, wherein the first periodic output potential controls said further precharge circuit which, when actuated, precharges a node of said precharge circuit.

10. A level translator circuit, comprising:
a level shifting circuit configured to generate a level shifted periodic potential in response to a first periodic input signal, wherein potentials of pulses of said level shifted periodic potential are shifted in value from potentials of corresponding pulses of said first periodic input signal;
a level translator circuit in electrical communication with said level shifting circuit at a supply node of said level translator circuit, said supply node configured to receive the level shifted periodic potential as a supply potential, and the level translator circuit also connectable to a reference potential, and including a decoupling circuit electrically interposed between the supply node and the reference node, said decoupling circuit configured to substantially maintain a maximum value of the level shifted periodic potential at the supply node;
a further level shifting circuit configured to generate a further level shifted periodic potential in response to the first periodic input signal;
a pass device in electrical communication, at a first terminal, with said further level shifting circuit and in electrical communication, at a control terminal, with said level translator circuit, said pass device being configured to drive a potential of a second terminal of said pass device toward a potential of one of the pulses of said further level shifted periodic potential in response to a level translated periodic output potential from said level translator circuit; and
a clamp circuit electrically interposed between the control terminal and the first terminal of said pass device, said clamp circuit configured to clamp a level translated periodic output potential from said level translator circuit to within one clamp circuit threshold voltage of the further level shifted periodic potential.

11. The level translator circuit of claim 10 wherein said level translator circuit is configured to respond to a second periodic input signal to generate said level translated periodic output potential.

12. The level translator circuit of claim 11, further comprising a precharge circuit for precharging the level translator circuit.

13. The level translator circuit of claim 12, wherein said precharge circuit is configured to generate, in response to a third periodic input signal, a precharge potential for precharging said level translator circuit.

14. A level translator circuit connectable to a charge pump, comprising:
a first level shifting circuit responsive to a first periodic input signal;
a second level shifting circuit responsive to a second periodic input signal;
a level translator circuit coupled to an output of said first level shifting circuit at a supply node of said level translator circuit, and the level translator circuit also connectable to a reference potential, and including a decoupling circuit electrically interposed between the supply node and the reference node, said decoupling circuit configured to substantially maintain a maximum value of a level shifted potential at the supply node;
a pass device coupled to said level translator circuit at a control node of said pass device, wherein said pass device is interposed between said second level shifting circuit and an output node of the charge pump, said pass device configured to drive an output potential on said output node of the charge pump toward an output potential from said second level shifting circuit in response to a level translated output potential from said level translator circuit; and
a clamp circuit electrically interposed between the control node and a terminal of the second level shifting circuit, said clamp circuit configured to clamp a level translated periodic output potential from said level translator circuit to within one clamp circuit threshold voltage of a level shifted periodic potential generated by the second level shifting circuit.

15. The level translator circuit of claim 14, wherein said first level shifting circuit provides a periodic supply potential at the supply node of the level translator circuit.

16. A method of level translating a signal having a first logic level and a second logic level, comprising:
providing a pumped supply potential at a pumped supply node of a level translator circuit;
providing a reference potential at a reference node of the level translator circuit;
substantially maintaining a maximum value of the pumped supply potential at the pumped supply node by electrically decoupling the pumped supply node from the reference node using a pull down portion of the level translator circuit, which is responsive to a control signal;
coupling a translator node to the pumped supply node in response to the first logic level of the control signal via a first coupling circuit; and
coupling the translator node to a second node connectable to a second potential in response to the second logic level of the signal via a second coupling circuit, wherein the first and second coupling circuit are actuated in a manner to prevent simultaneous active coupling to the translator node.

17. A method of level translating a signal having a first logic level and a second logic level, comprising:
providing a pumped supply potential at a pumped supply node of a level translator circuit;
providing a reference potential at a reference node of the level translator circuit;
substantially maintaining a maximum value of the pumped supply potential at the pumped supply node by electrically decoupling the pumped supply node from the reference node;
coupling a translator node to the pumped supply node in response to the first logic level of the signal via a first coupling circuit; and
after a time delay period coupling the translator node to a second node connectable to a second potential in response to the second logic level of the signal via a second coupling circuit, wherein the first and second coupling circuit are isolated during the time delay to prevent simultaneous active coupling to the translator node.

18. A method of level translating a signal having a first logic level and a second logic level, comprising:
providing a pumped supply potential at a pumped supply node of a level translator circuit;
providing a reference potential at a reference node of the level translator circuit;

substantially maintaining a maximum value of the pumped supply potential at the pumped supply node by electrically decoupling the pumped supply node from the reference node;

providing a periodic input control signal having a first potential and a second potential at a control node of the level translator circuit;

deactivating a pull-up circuit in response to the periodic input control signal transitioning from the first potential to the second potential;

decoupling a level translator output node connected to said pull-up circuit from the pumped supply node in response to said step of deactivating;

isolating the level translator output node from a pull-down circuit, having a second supply node, for a pre-determined period of time;

activating said pull-down circuit in response to the second potential of the periodic input control signal; and coupling the level translator output node to said second supply node following the pre-determined time period.

19. A method of level translating a signal having a first logic level and a second logic level, comprising:

providing a pumped supply potential at a pumped supply node of a level translator circuit;

providing a reference potential at a reference node of the level translator circuit; and substantially maintaining a maximum value of the pumped supply potential at the pumped supply node by electrically decoupling the pumped supply node from the reference node;

coupling a translator node to the pumped supply node in response to the first logic level of the signal via a first coupling circuit; and after a time delay period coupling the translator node to a second node connectable to a second potential in response to the second logic level of the signal via a second coupling circuit, wherein the first and second coupling circuit are isolated during the time delay to prevent simultaneous active coupling to the translator node.

20. The method of claim 19, further comprising:

providing a periodic input control signal having a first potential and a second potential at a control node of the level translator circuit;

deactivating a pull-up circuit in response to the periodic input control signal transitioning from the first potential to the second potential;

decoupling a level translator output node connected to said pull-up circuit from the pumped supply node in response to said step of deactivating;

isolating the level translator output node from a pull-down circuit, having a second supply node, for a pre-determined period of time;

activating said pull-down circuit in response to the second potential of the periodic input control signal; and coupling the level translator output node to said second supply node following the pre-determined time period.

21. A level translator electrically interposed between a pumped supply node connectable to a pumped supply potential and a reference node connectable to a reference potential, comprising:

a decoupling circuit electrically interposed between the pumped supply node and the reference node, the decoupling circuit configured to substantially maintain a maximum value of the pumped supply potential at the pumped supply node;

a pull up circuit operably coupled to the pumped supply node, the pull up circuit also coupled to a first control node and selectively operable in response to a first control signal at the control node;

a pull down circuit operably coupled to the pull up circuit and to a second control node, the pull down circuit selectively operable in response to a second control signal at the second control node; and an intermediate circuit operably connected to the pull up circuit and the pull down circuit, the intermediate circuit including means for precluding simultaneous operation of the pull up circuit and the pull down circuit.

\* \* \* \* \*